(12) United States Patent
Hu et al.

(10) Patent No.: US 12,052,869 B2
(45) Date of Patent: Jul. 30, 2024

(54) 3D AND FLASH MEMORY DEVICE AND METHOD OF FABRICATING THE SAME

(71) Applicant: MACRONIX International Co., Ltd., Hsinchu (TW)

(72) Inventors: Chih-Wei Hu, Miaoli County (TW); Teng-Hao Yeh, Hsinchu County (TW); Hang-Ting Lue, Hsinchu (TW)

(73) Assignee: MACRONIX International Co., Ltd., Hsinchu (TW)

( * ) Notice: Subject to any disclaimer, the term of this patent is extended or adjusted under 35 U.S.C. 154(b) by 384 days.

(21) Appl. No.: 17/475,932

(22) Filed: Sep. 15, 2021

(65) Prior Publication Data

US 2023/0082361 A1    Mar. 16, 2023

(51) Int. Cl.
*H10B 43/27* (2023.01)
*H10B 41/27* (2023.01)

(52) U.S. Cl.
CPC .......... *H10B 43/27* (2023.02); *H10B 41/27* (2023.02)

(58) Field of Classification Search
CPC ........ H10B 43/27; H10B 41/27; H10B 41/20; H10B 43/20
See application file for complete search history.

(56) References Cited

U.S. PATENT DOCUMENTS

| 2010/0265773 A1 | 10/2010 | Lung et al. |
| 2021/0074726 A1* | 3/2021 | Lue ........................ H10B 51/30 |

FOREIGN PATENT DOCUMENTS

| CN | 112567518 | 3/2021 |
| TW | 202109770 | 3/2021 |
| TW | 202111925 | 3/2021 |
| TW | 202117934 | 5/2021 |
| TW | I738489 | 9/2021 |

OTHER PUBLICATIONS

"Office Action of Taiwan Counterpart Application", issued on Oct. 17, 2022, pp. 1-4.

* cited by examiner

Primary Examiner — Tucker J Wright
(74) Attorney, Agent, or Firm — J.C. PATENTS

(57) ABSTRACT

A three-dimensional AND flash memory device includes a stack structure, isolators, channel pillars, source pillars and drain pillars, and charge storage structures. The stack structure is located on a dielectric substrate and includes gate layers and insulating layers alternately stacked with each other. The isolators divide the stack structure into sub-blocks and include walls and slits. The walls include isolation layers and the insulating layers stacked alternately with each other, and the isolation layers are buried in the gate layers. The slits alternate with the walls, and each of the slits extends through the stack structure. The channel pillars extend through the stack structure in each of the sub-blocks. The source pillars and the drain pillars are located in the channel pillars. The charge storage structures are located between the gate layers and the channel pillar.

18 Claims, 19 Drawing Sheets

US 12,052,869 B2

3D AND FLASH MEMORY DEVICE AND METHOD OF FABRICATING THE SAME

BACKGROUND

Technical Field

The embodiment of the disclosure relates to a semiconductor device and a method of fabricating the same, and particularly, to a 3D AND flash memory device and a method of fabricating the same.

Description of Related Art

Since a non-volatile memory has the advantage that stored data does not disappear at power-off, it becomes a widely used memory for a personal computer or other electronics equipment. Currently, the three-dimensional (3D) memory commonly used in the industry includes a NOR memory and a NAND memory. In addition, another type of 3D memory is an AND memory, which can be applied to a multi-dimensional memory array with high integration and high area utilization, and has an advantage of a fast operation speed. Therefore, the development of a 3D memory device has gradually become the current trend.

SUMMARY

The embodiments of the disclosure provide a 3D AND flash memory device and a method of fabricating the same capable of reducing tilting or collapse of a stack structure.

A three-dimensional AND flash memory device according to an embodiment of the disclosure includes a stack structure, a plurality of isolators, a plurality of channel pillars, a plurality of source pillars and a plurality of drain pillars, and a plurality of charge storage structures. The stack structure is located on a dielectric substrate, and the stack structure includes a plurality of gate layers and a plurality of insulating layers alternately stacked with each other. The isolators divide the stack structure into a plurality of sub-blocks and include a plurality of walls and a plurality of slits. The walls include a plurality of isolation layers and the plurality of insulating layers stacked alternately with each other, and the isolation layers are buried in the gate layers. The slits alternate with the walls, and each of the slits extends through the gate layers and the insulating layers of the stack structure. The channel pillars extend through the stack structure in each of the sub-blocks. The source pillars and the drain pillars are located in the channel pillars and are electrically connected to the channel pillars. The charge storage structures are located between the gate layers and the channel pillar.

A method of fabricating a three-dimensional AND flash memory device according to an embodiment of the disclosure includes the following steps. A stack structure is formed on a dielectric substrate, and the stack structure includes a plurality of middle layers and a plurality of insulating layers stacked alternately with each other. A plurality of channel pillars extending through the stack structure are formed. A plurality of source pillars and a plurality of drain pillars are formed in the channel pillars, and the source pillars and the drain pillars are electrically connected to the channel pillars. The stack structure is patterned to form a plurality of slit trenches in the stack structure, and each of the slit trenches extends through the middle layers and the insulating layers of the stack structure. The middle layers are partially removed to form a plurality of horizontal openings, and an unremoved portion of the middle layers forms a plurality of isolation layers. The isolation layers and the insulating layers form a plurality of walls, and the slit trenches and the walls alternate with each other and divide the stack structure into a plurality of sub-blocks. A plurality of gate layers are formed in the horizontal openings, and each of the isolation layers is sandwiched between the gate layers. A plurality of charge storage structures located between the gate layers and the channel pillar are formed. A plurality of slits are formed in the slit trenches, and the slits and the walls alternate with each other and divide the stack structure into a plurality of sub-blocks.

Based on the above, in the embodiments of the disclosure, the middle layers are retained to serve as the isolators, which can reduce the number of slit trenches and thereby prevent collapse of the stack structure.

BRIEF DESCRIPTION OF THE DRAWINGS

FIG. 2C to FIG. 2G are cross-sectional views taken along line IV-IV' of FIG. 3A to FIG. 3E.

DESCRIPTION OF THE EMBODIMENTS

The gate of a 3D flash memory is formed by performing a gate replacement process on middle layers in a stack structure of insulating layers and the middle layers. However, after the middle layers are removed, the structural strength of the stack structure is undesirable and the support is insufficient, so tilting or collapse often occurs. As a result, misalignment occurs during subsequent formation of a global bit line (GBL) contact, which causes a short circuit between the formed contact and the top gate layer. In the embodiment of the disclosure, part of the middle layers is retained to serve as isolation layers, which may form a wall together with the insulating layers above and below. The wall may serve as a supporting structure together with a channel pillar to prevent tilting or collapse of the stack structure. Therefore, it is possible to improve the yield and prevent a short circuit from occurring between the contact and the top gate layer.

Figure 1A:
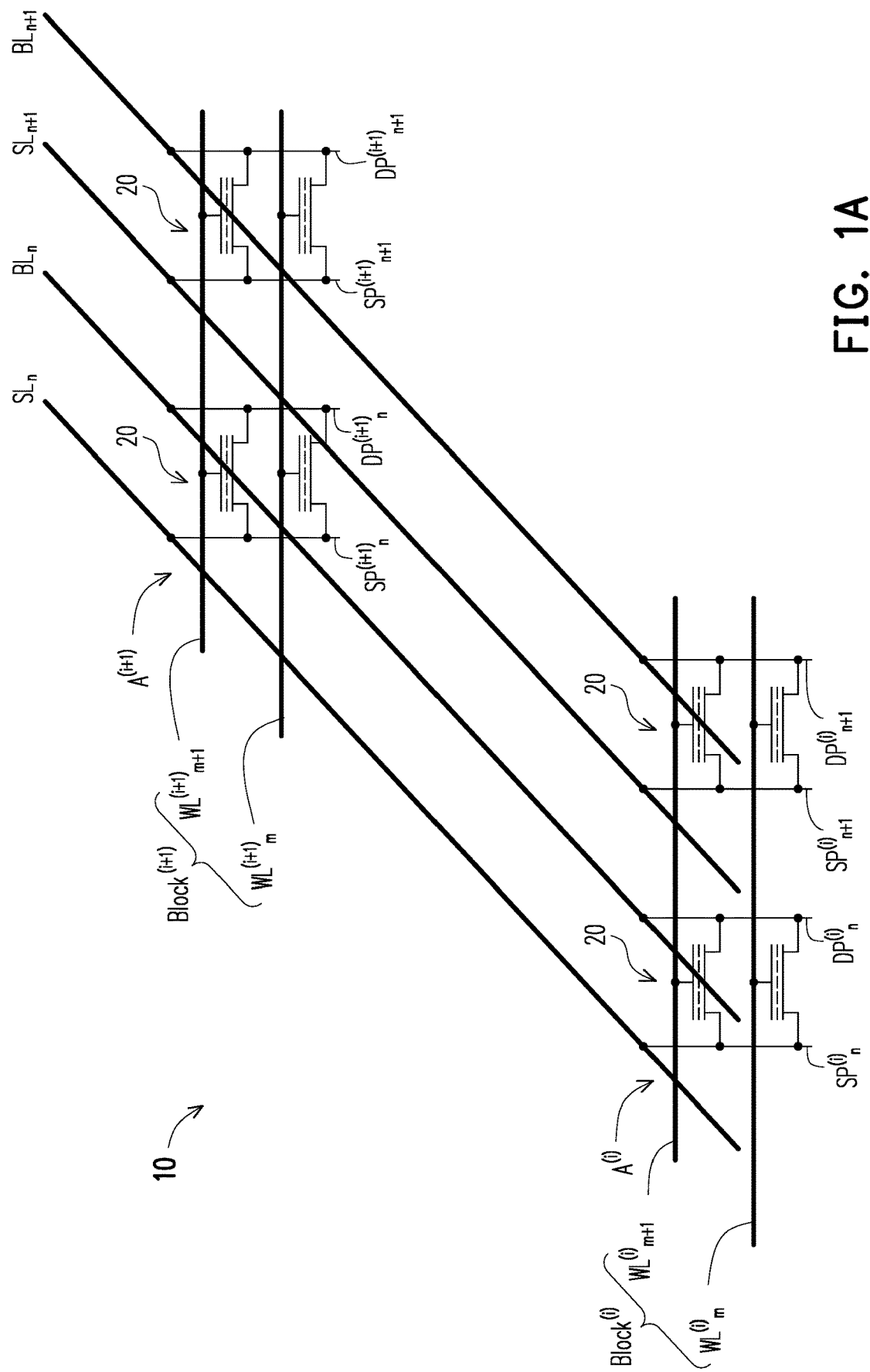
FIG. 1A shows a circuit diagram of a 3D AND flash memory array according to some embodiments.
Figure 1B:
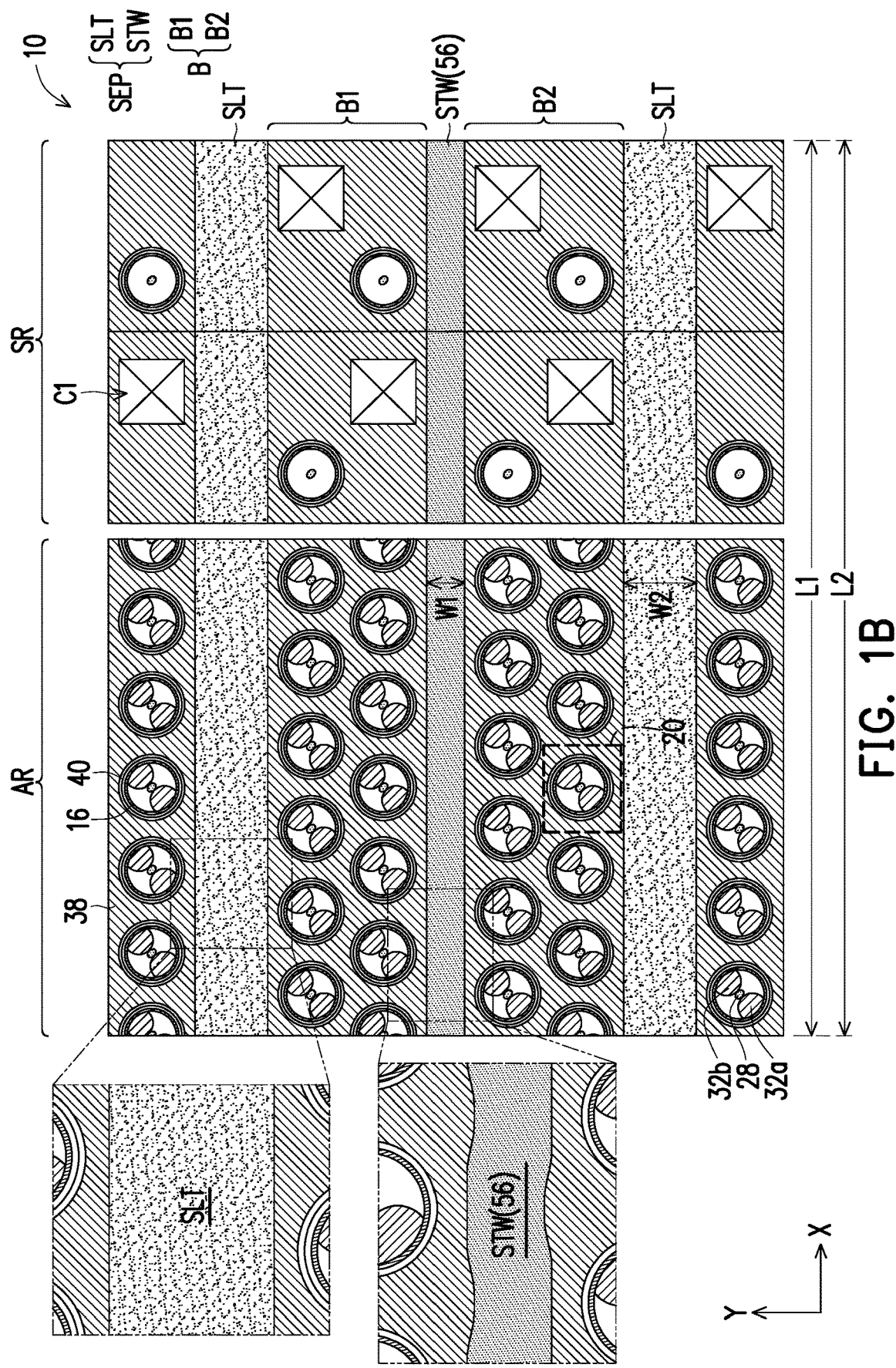
FIG. 1B shows a top view of a 3D AND flash memory array according to some embodiments.
Figure 1C:
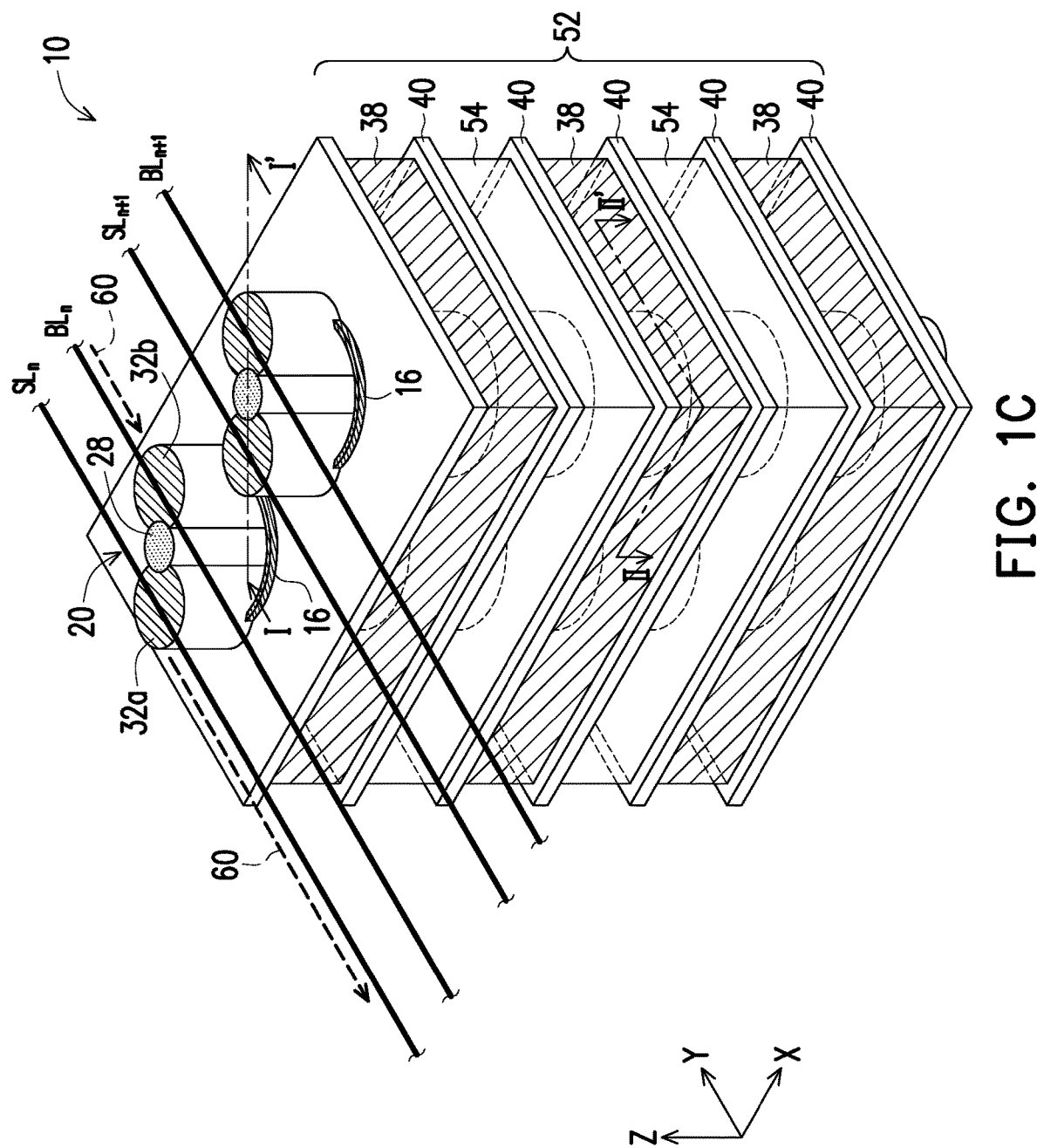
FIG. 1C shows a partial simplified perspective view of a part of the memory array in FIG. 1B.
Figure 1D:
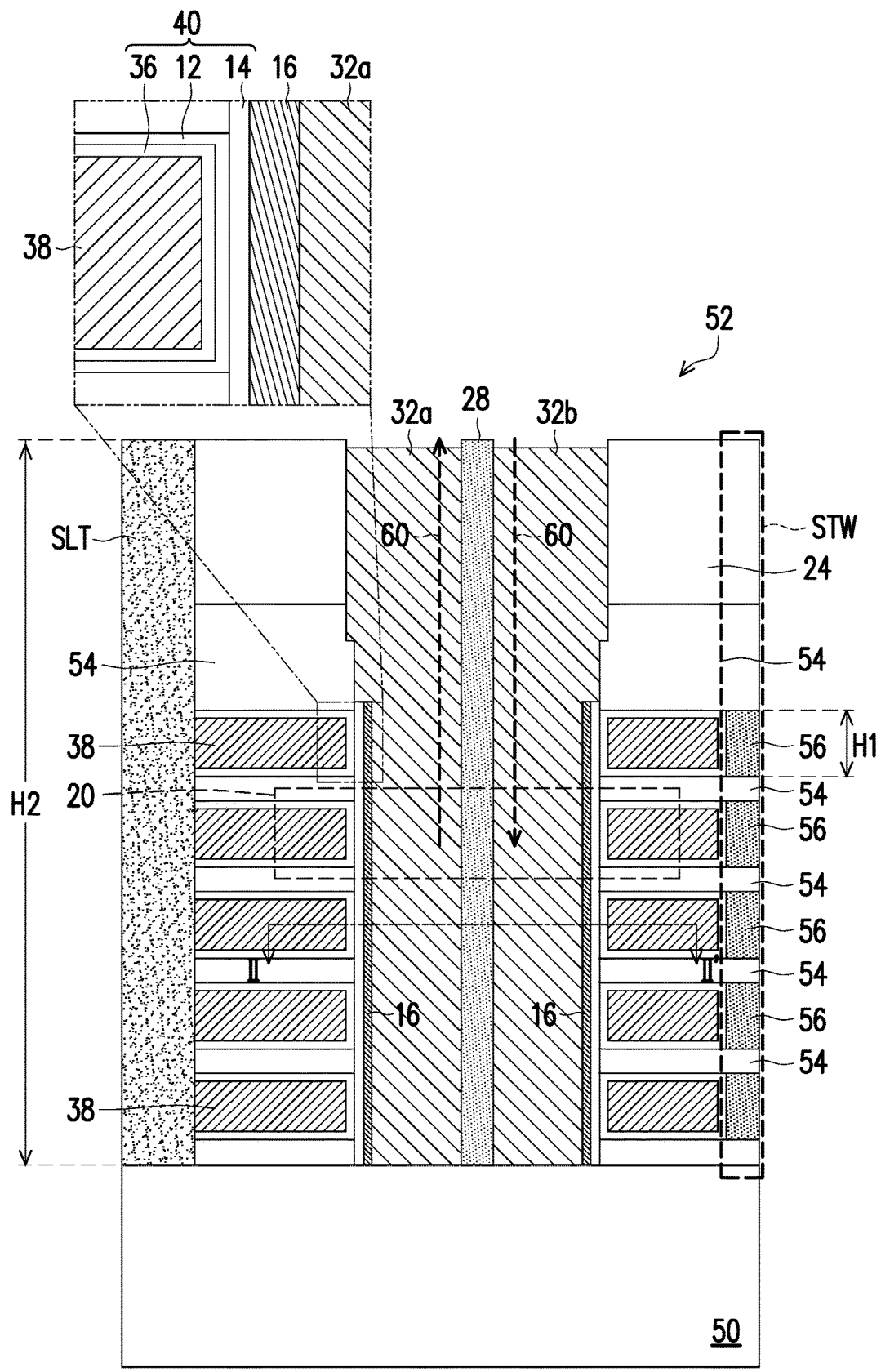
FIG. 1D show cross-sectional views taken along line I-I' of FIG. 1C.
Figure 1E:
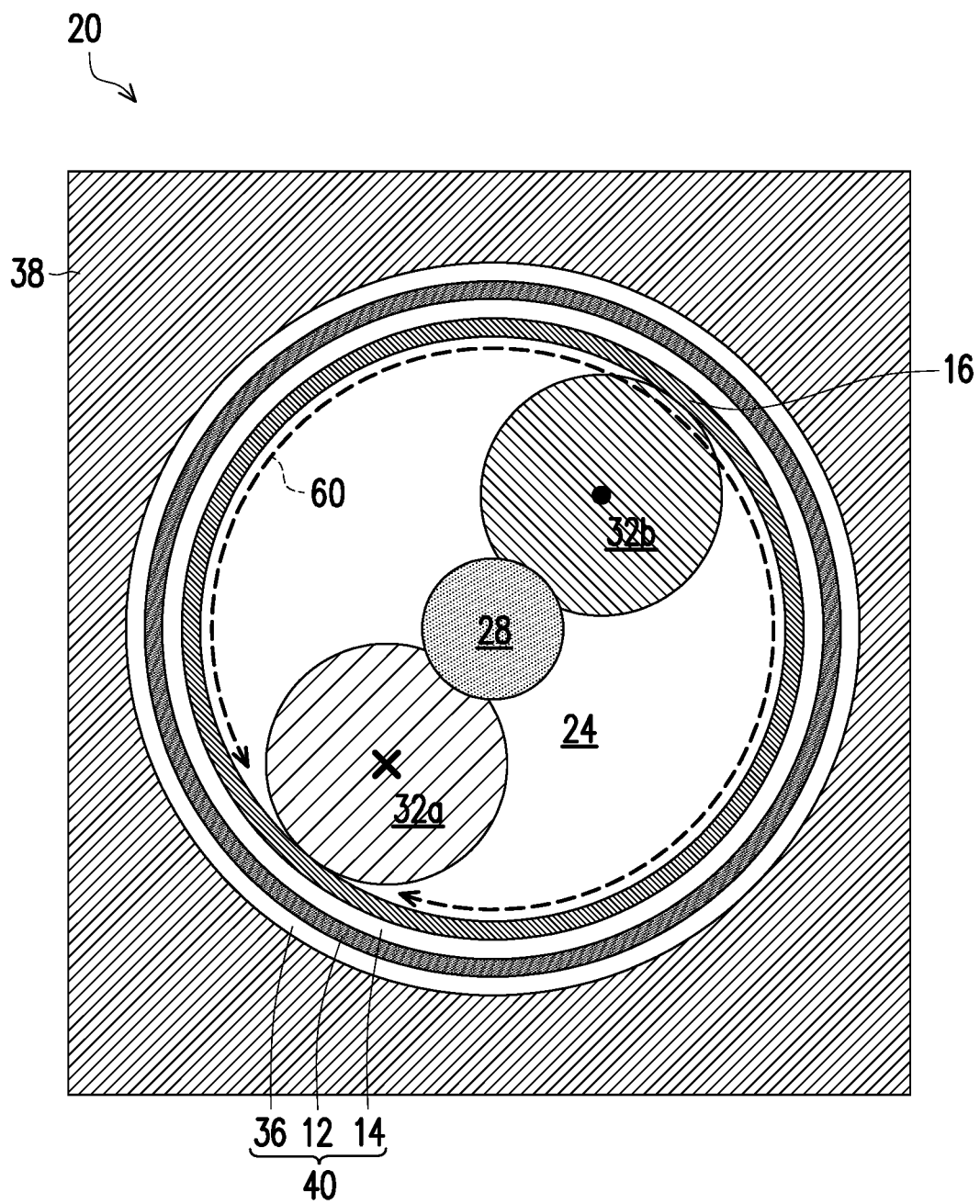
FIG. 1E shows a top view taken along line II-II' of FIG. 1C, and FIG. 1D.

FIG. 1A shows a circuit diagram of a 3D AND flash memory array according to some embodiments. FIG. 1B shows a top view of a 3D AND flash memory array according to some embodiments. FIG. 1C shows a partial simplified perspective view of a part of the memory array in FIG. 1B. FIG. 1D shows cross-sectional views taken along line I-I' of FIG. 1C. FIG. 1E shows a top view taken along line II-II' of FIG. 1C, and FIG. 1D.

FIG. 1A shows a schematic view of two sub-blocks BLOCK$^{(i)}$ and BLOCK$^{(i+1)}$ of a vertical AND memory array 10 arranged in rows and columns. The sub-block BLOCK$^{(i)}$ includes a memory array A$^{(i)}$. A row (e.g., an (m+1)$^{th}$ row) of the memory array A$^{(i)}$ is a set of AND memory cells 20 having a common word line (e.g., WL$^{(i)}_{m+1}$). The AND memory cells 20 in each row (e.g., the (m+1)$^{th}$ row) correspond to a common word line (e.g., WL$^{(i)}_{m+1}$) and are coupled to different source pillars (e.g., SP$^{(i)}_n$ and SP$^{(i)}_{n+1}$) and drain pillars (e.g., DP$^{(i)}_n$ and DP$^{(i)}_{n+1}$), so that the AND memory cells 20 are logically arranged in a row along the common word line (e.g., WL$^{(i)}_{m+1}$).

A column (e.g., an n$^{th}$ column) of the memory array A$^{(i)}$ is a set of AND memory cells 20 having a common source pillar (e.g., SP$^{(i)}_n$) and a common drain pillar (e.g., DP$^{(i)}_n$). The AND memory cells 20 in each column (e.g., the n$^{th}$ column) correspond to different word lines (e.g., WL$^{(i)}_{m+1}$ and WL$^{(i)}_m$) and are coupled to a common source pillar (e.g., SP$^{(i)}_n$) and a common drain pillar (e.g., DP$^{(i)}_n$), so that the AND memory cells 20 are logically arranged in a column along the common source pillar (e.g., SP$^{(i)}_n$) and the common drain pillar (e.g., DP$^{(i)}_n$). In the physical layout, according to the fabrication method as applied, the columns or rows may be twisted and arranged in a honeycomb pattern or other patterns for high density or other reasons.

In FIG. 1A, in the sub-block BLOCK$^{(i)}$, the AND memory cells 20 in the n$^{th}$ column of the memory array A$^{(i)}$ share a common source pillar (e.g., SP$^{(i)}_n$) and a common drain pillar (e.g., DP$^{(i)}_n$). The AND memory cells 20 in an (n+1)$^{th}$ column share a common source pillar (e.g., SP$^{(i)}_{n+1}$) and a common drain pillar (e.g., DP$^{(i)}_{n+1}$) and are coupled to a common bit line (e.g., BL$_{n+1}$).

In some embodiments, the sub-block BLOCK$^{(i+1)}$ includes a memory array A$^{(i+1)}$, which is similar to the memory array A$^{(i)}$ in the sub-block BLOCK$^{(i)}$. A row (e.g., an (m+1)$^{th}$ row) of the memory array A$^{(i+1)}$ is a set of AND memory cells 20 having a common word line (e.g., WL$^{(i+1)}_{m+1}$). The AND memory cells 20 in each row (e.g., the (m+1)$^{th}$ row) correspond to a common word line (e.g., WL$^{(i+1)}_{m+1}$) and are coupled to different source pillars (e.g., SP$^{(i+1)}_n$ and SP$^{(i+1)}_{n+1}$) and drain pillars (e.g., DP$^{(i+1)}_n$ and DP$^{(i+1)}_{n+1}$). A column (e.g., an n$^{th}$ column) of the memory array A$^{(i+1)}$ is a set of AND memory cells 20 having a common source pillar (e.g., SP$^{(i+1)}_n$) and a common drain pillar (e.g., DP$^{(i+1)}_n$). The AND memory cells 20 in each column (e.g., the n$^{th}$ column) correspond to different word lines (e.g., WL$^{(i+1)}_{m+1}$ and WL$^{(i+1)}_m$) and are coupled to a common source pillar (e.g., SP$^{(i+1)}_n$) and a common drain pillar (e.g., DP$^{(i+1)}_n$), so that the AND memory cells 20 are logically arranged in a column along the common source pillar (e.g., SP$^{(i+1)}_n$) and the common drain pillar (e.g., DP$^{(i+1)}_n$).

The sub-block BLOCK$^{(i+1)}$ and the sub-block BLOCK$^{(i)}$ share source lines (e.g., SL$_n$ and SL$_{n+1}$) and bit lines (e.g., BL$_n$ and BL$_{n+1}$). Therefore, the source line SL$_n$ and the bit line BL$_n$ are coupled to the n$^{th}$ column of AND memory cells 20 in the AND memory array of the sub-block BLOCK$^{(i)}$, and are coupled to the n$^{th}$ column of AND memory cells 20 in the AND memory array of the sub-block BLOCK$^{(i+1)}$. Similarly, the source line SL$_{n+1}$ and the bit line BL$_{n+1}$ are coupled to the (n+1)$^{th}$ column of AND memory cells 20 in the AND memory array of the sub-block BLOCK$^{(i)}$, and are coupled to the (n+1)$^{th}$ column of AND memory cells 20 in the AND memory array of the sub-block BLOCK$^{(i+1)}$.

Referring to FIG. 1B, the memory array 10 may include a plurality of isolators SEP to divide a gate stack structure 52 into a plurality of sub-blocks B such as a sub-block B1 and a sub-block B2. The isolators SEP of the disclosure include a plurality of walls STW and a plurality of slits SLT alternately arranged in the Y direction. The wall STW and the slit SLT have different insulating materials. The insulating material may include an organic insulating material, an inorganic insulating material, or a combination thereof. The wall STW is a stack structure of middle layers 56 and insulating layers 54 as shown in FIG. 1D. The middle layer 56 and insulating layer 54 are, for example, silicon nitride and silicon oxide, respectively. The slit SLT is, for example, silicon oxide. The sub-blocks B1 and B2 may each include a gate stack structure 52, a plurality of channel pillars 16, a plurality of conductive pillars (also referred to as source pillars) 32a, a plurality of conductive pillars (also referred to as drain pillars) 32b, and a plurality of charge storage structures 40, which are disposed on a dielectric substrate 50, as shown in FIG. 1C.

Referring to FIG. 1B and FIG. 1C, the memory array 10 may be disposed in a back end of line (BEOL) of a semiconductor die. For example, the memory array 10 may be disposed in an interconnect structure of a semiconductor die, for example, being disposed on one or more active devices (e.g., transistors) formed on a semiconductor substrate. Therefore, the dielectric substrate 50 is, for example, a dielectric layer (e.g., a silicon oxide layer) over a metal interconnect structure formed on a silicon substrate. The dielectric substrate 50 may include an array region AR and a staircase region SR.

Referring to FIG. 1B and FIG. 1C, a gate stack structure 52 is formed on the dielectric substrate 50 in the array region AR and the staircase region SR. The gate stack structure 52 includes a plurality of gate layers (also referred to as word lines) 38 and a plurality of insulating layer 54 vertically stacked on the surface of the dielectric substrate 50. In the Z direction, the gate layers 38 are electrically isolated from each other by the insulating layer 54 disposed therebetween. The gate layer 38 extends in a direction parallel to the surface of the dielectric substrate 50 (shown in FIG. 1D). The gate layers 38 in the staircase region SR may have a staircase structure SC (shown in FIG. 1B), so that a lower gate layer 38 is longer than an upper gate layer 38, and the end of a lower gate layer 38 extends laterally beyond the end of an upper gate layer 38. A contact C1 for connecting the gate layer 38 may land on the end of the gate layer 38 to connect the gate layers 38 respectively to conductive lines.

Referring to FIG. 1B to FIG. 1E, the memory array 10 further includes a plurality of channel pillars 16. The channel pillar 16 continuously extends through the gate stack structure 52 in the array region AR. In some embodiments, the channel pillar 16 may have a ring-shaped profile in a top view. The material of the channel pillar 16 may be semiconductor such as undoped polysilicon.

Referring to FIG. 1C to FIG. 1E, the memory array 10 further includes an insulating filling layer 24, an insulating pillar 28, a plurality of conductive pillars (also referred to as source pillars) 32a, and a plurality of conductive pillars (also referred to as drain pillars) 32b. The conductive pillars 32a and 32b and the insulating pillar 28 are disposed in the channel pillar 16 and each extend in a direction (i.e., the Z direction) perpendicular to the gate layer 38. The conductive pillars 32a and 32b are separated from each other by the insulating filling layer 24 and the insulating pillar 28 and are electrically coupled to the channel pillar 16. The conductive pillars 32a and 32b are, for example, doped polysilicon. The insulating pillar 28 is, for example, silicon nitride.

Referring to FIG. 1D, a charge storage structure 40 is disposed between the channel pillar 16 and the gate layers 38. The charge storage structure 40 may include a tunneling layer (or referred to as a bandgap engineered tunneling oxide layer) 14, a charge storage layer 12, and a blocking layer 36. The charge storage layer 12 is located between the tunneling layer 14 and the blocking layer 36. In some embodiments, the tunneling layer 14, the charge storage layer 12, and the blocking layer 36 are, for example, silicon oxide, silicon nitride, and silicon oxide. In some embodiments, a part (the tunneling layer 14) of the charge storage structure 40 continuously extends in a direction (i.e., the Z direction) perpendicular to the gate layer 38, and the other part (the charge storage layer 12 and the blocking layer 36) of the charge storage structure 40 surrounds the gate layer 38, as shown in FIG. 1D.

Referring to FIG. 1E, the gate layer 38, and the charge storage structure 40, the channel pillar 16, the source pillar 32a, and the drain pillar 32b, which are surrounded by the gate layer 38, define the memory cell 20. According to different operation methods, a 1-bit operation or a 2-bit operation may be performed on the memory cell 20. For example, when a voltage is applied to the source pillar 32a and the drain pillar 32b, since the source pillar 32a and the drain pillar 32b are connected to the channel pillar 16, electrons may be transferred along the channel pillar 16 and stored in the entire charge storage structure 40. Accordingly, a 1-bit operation may be performed on the memory cell 20. In addition, for an operation involving Fowler-Nordheim tunneling, electrons or holes may be trapped in the charge storage structure 40 between the source pillar 32a and the drain pillar 32b. For an operation involving source side injection, channel-hot-electron injection, or band-to-band tunneling hot carrier injection, electrons or holes may be locally trapped in the charge storage structure 40 adjacent to one of the source pillar 32a and the drain pillar 32b. Accordingly, a single level cell (SLC, 1 bit) or multi-level cell (MLC, greater than or equal to 2 bits) operation may be performed on the memory cell 20.

During operation, a voltage is applied to a selected word line (gate layer) 38; for example, when a voltage higher than a corresponding threshold voltage (Vth) of the corresponding memory cell 20 is applied, a channel region of the channel pillar 16 intersecting the selected word line 38 is turned on to allow a current to enter the drain pillar 32b from the bit line $BL_n$ or $BL_{n+1}$ (shown in FIG. 1C), flow to the source pillar 32a via the turned-on channel region (e.g., in a direction indicated by arrow 60), and finally flow to the source line $SL_n$ or $SL_{n+1}$ (shown in FIG. 1C).

Referring to FIG. 1B, the gate layers 38 are formed by removing middle layers from a stack structure of insulating layers 54 and the middle layers and performing a gate replacement process. In the disclosure, part of the middle layers is retained to serve as isolation layers 56. The isolation layers 56 and the insulating layers 54 are stacked on each other to form the walls STW between the sub-blocks B.

The isolation layer 56 of the wall STW and the slit SLT extend continuously in the X direction. In some embodiments, the isolation layer 56 of the wall STW extends continuously in the array region AR and extends to the staircase region SR. In other embodiments, the isolation layer 56 of the wall STW extends continuously in the array region AR but does not extend to the staircase region SR. In other words, a length L1 of the isolation layer 56 of the wall STW in the X direction is less than or equal to a length L2 of the slit SLT in the X direction.

Furthermore, a width W1 of the isolation layer 56 of the wall STW in the Y direction is less than or equal to a width W2 of the slit SLT in the Y direction. A height H1 of the isolation layer 56 of the wall STW in the Z direction is less than or equal to a height H2 of the slit SLT in the Z direction, as shown in FIG. 1D. In addition, the isolation layer 56 of the wall STW and the slit SLT have different profiles. In a top view, the isolation layer 56 of the wall STW has a curved profile, and the slit SLT is substantially rectangular, as shown in FIG. 1B.

In the disclosure, the retained isolation layers 56 and the insulating layers 54 may together serve as the wall STW between the sub-blocks B. Therefore, the isolation layers 56 may serve as a supporting structure to reduce the number of slit trenches used to form the slits SLT and prevent tilting or collapse of the stack structure due to the removal of the middle layers during the gate replacement process.

Figure 4:
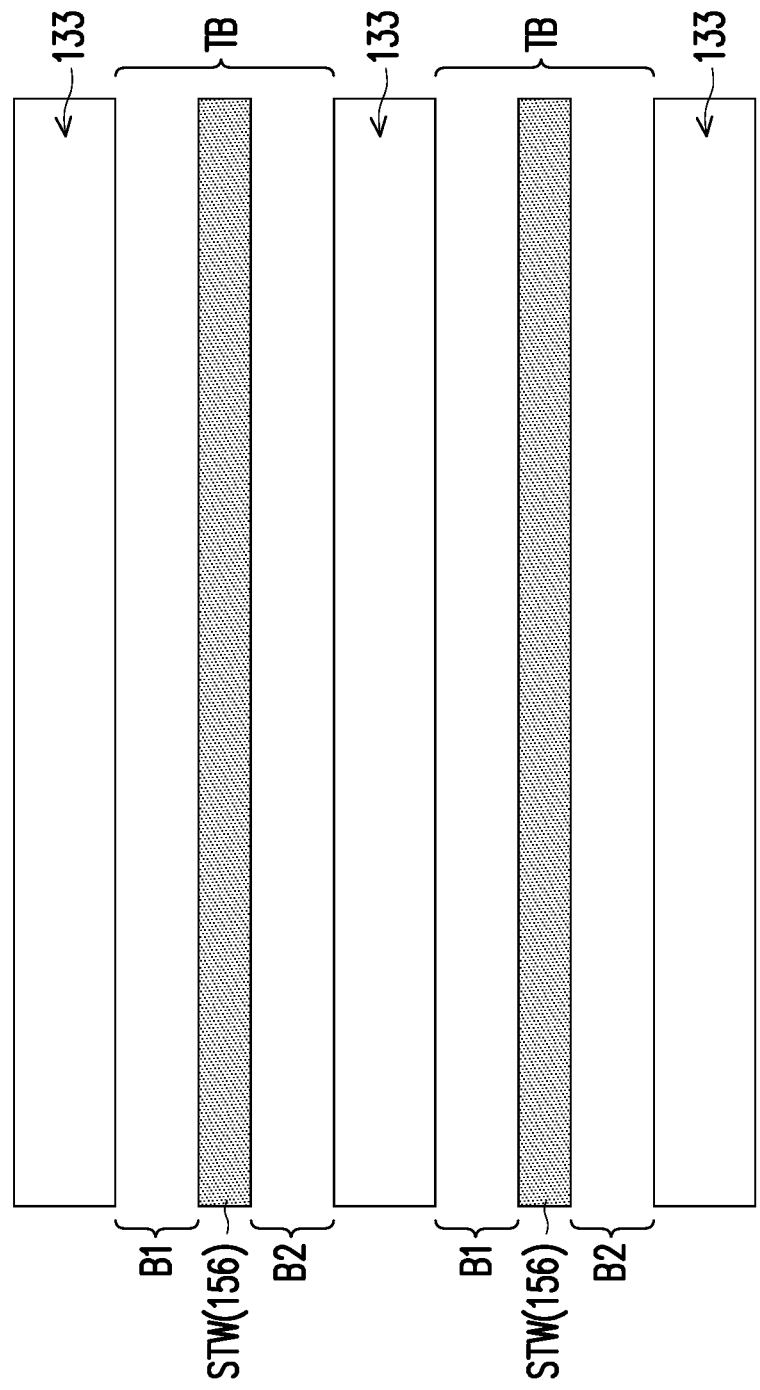
FIG. 4 shows a top view of an isolator of a 3D AND flash memory device.
Figure 5:
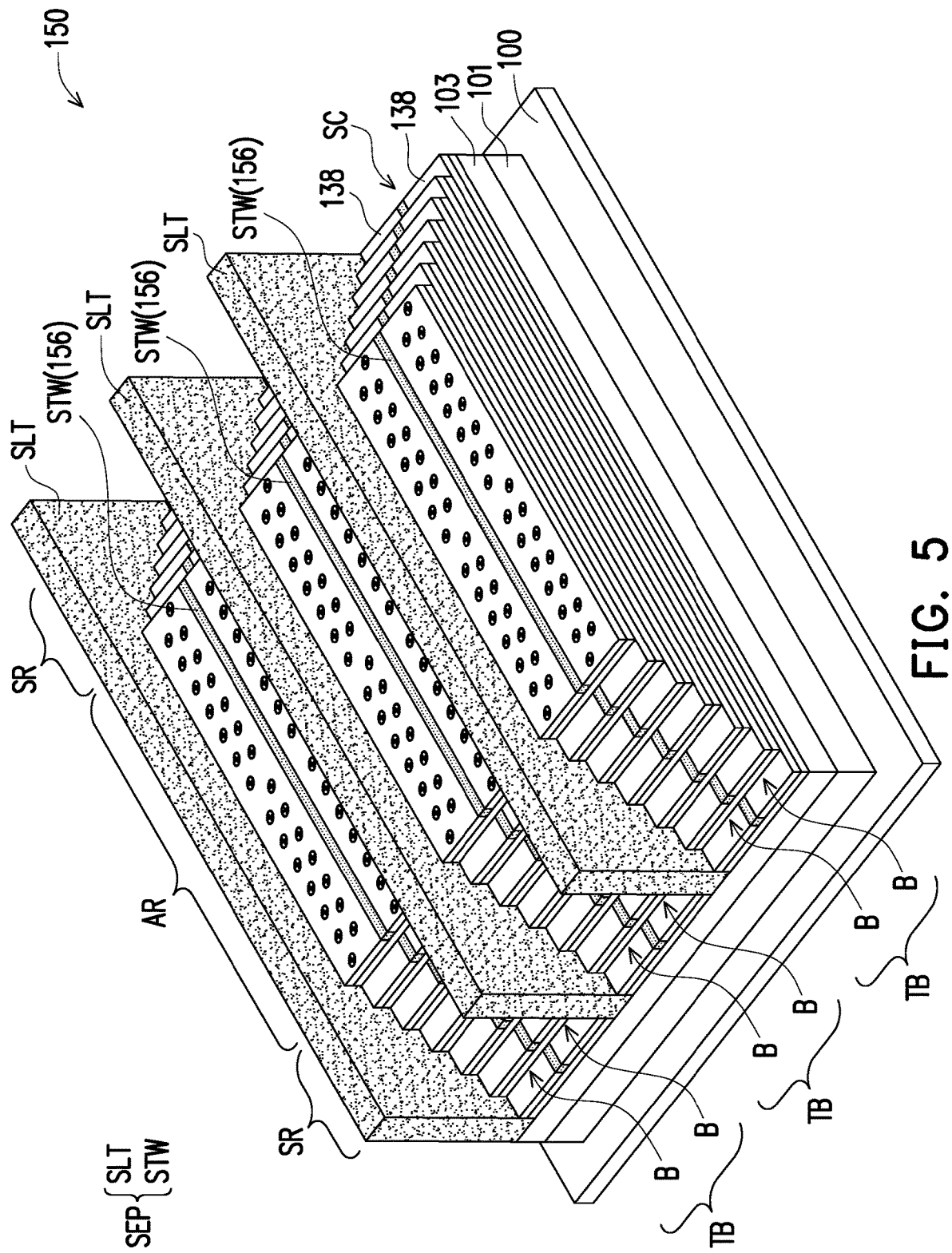
FIG. 5 shows a perspective view of a 3D AND flash memory device.

A method of forming the wall STW will be described in detail with reference to FIG. 2A to FIG. 2G and FIG. 3A to FIG. 3E. FIG. 2A to FIG. 2G are schematic cross-sectional views of a 3D AND flash memory device according to an embodiment of the disclosure. FIG. 2C to FIG. 2G are cross-sectional views taken along line IV-IV' of FIG. 3A to FIG. 3E. FIG. 3A to FIG. 3E show top views taken along line III-III' of FIG. 2C to FIG. 2G. FIG. 4 shows a top view of an isolator of a 3D AND flash memory device. FIG. 5 shows a perspective view of a 3D AND flash memory device.

Figure 2A:
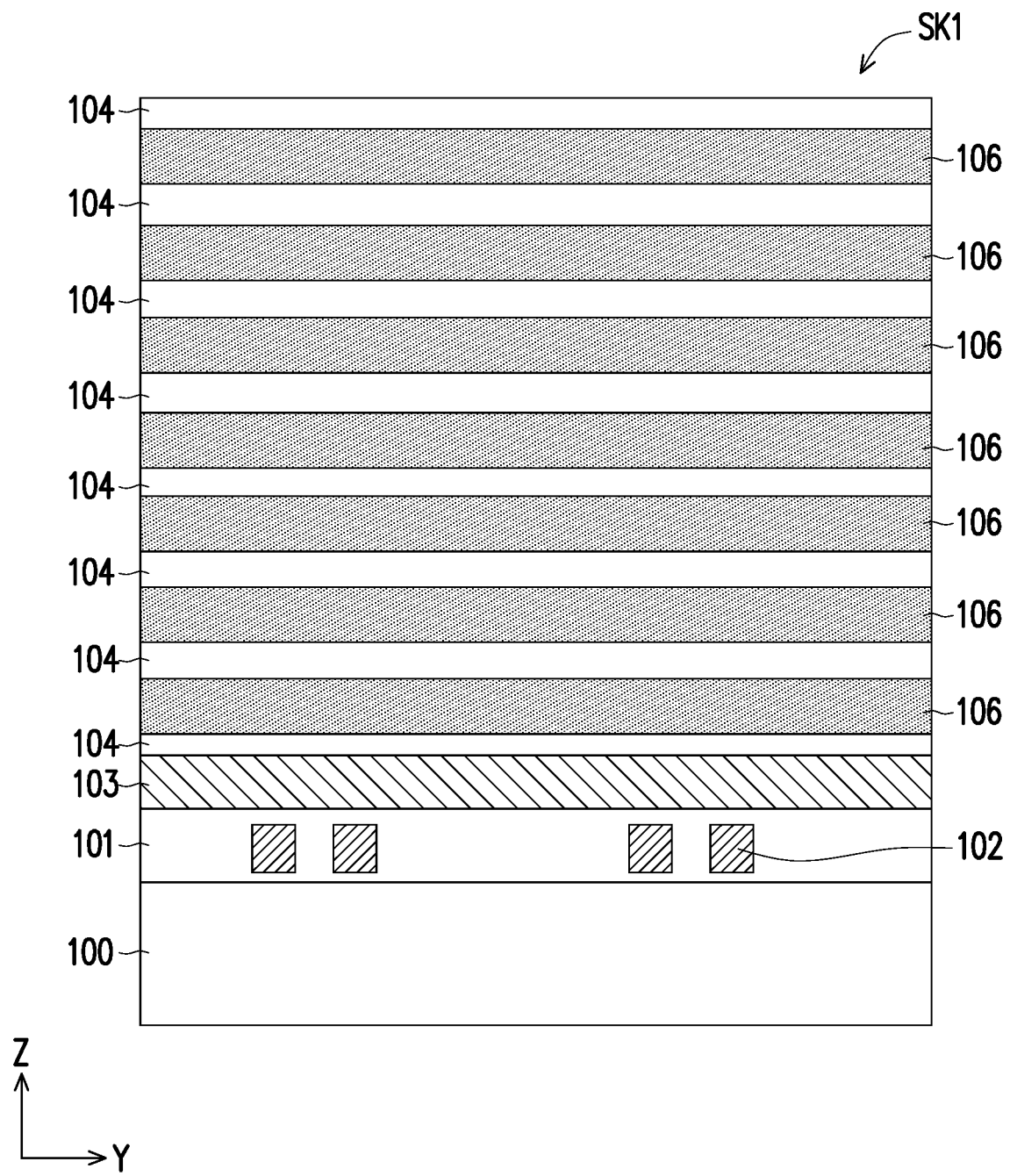
FIG. 2A to FIG. 2G are schematic cross-sectional views of a 3D AND flash memory device according to an embodiment of the disclosure.

Referring to FIG. 2A, a dielectric substrate 100 is provided. The dielectric substrate 100 is, for example, a dielectric layer (e.g., a silicon oxide layer) of a metal interconnect structure formed on a silicon substrate. The dielectric substrate 100 includes an array region AR and a staircase region SR. A stack structure SK1 is formed on the dielectric substrate 100 in the array region AR and the staircase region SR. The stack structure SK1 may also be referred to as an insulating stack structure SK1. In this embodiment, the stack structure SK1 is composed of insulating layers 104 and middle layers 106 that are sequentially alternately stacked on the dielectric substrate 100. In other embodiments, the stack structure SK1 may be composed of middle layers 106 and insulating layers 104 that are sequentially alternately stacked on the dielectric substrate 100. In addition, in this embodiment, the uppermost layer of the stack structure SK1 is the insulating layer 104. The insulating layer 104 is, for example, a silicon oxide layer. The middle layer 106 is, for example, a silicon nitride layer. The middle layer 106 may servers as a sacrificial layer which may be partially removed in the subsequent process. In this embodiment, the stack structure SK1 has eight insulating layers 104 and seven middle layers 106, but the disclosure is not limited thereto. In other embodiments, more insulating layers 104 and more middle layers 106 may be formed according to the actual requirements.

In some embodiments, before the stack structure SK1 is formed, an insulating layer 101, a stop layer 102, and a conductive layer 103 are first formed on the dielectric substrate 100. The insulating layer 101 is, for example, silicon oxide. The stop layer 102 is formed in the insulating layer 101. The stop layer 102 is, for example, a conductive pattern such as a polysilicon pattern. The conductive layer 103 is, for example, a grounded polysilicon layer. The conductive layer 103 may also be referred to as a dummy gate, which may be used to close a leakage path.

Figure 3A:
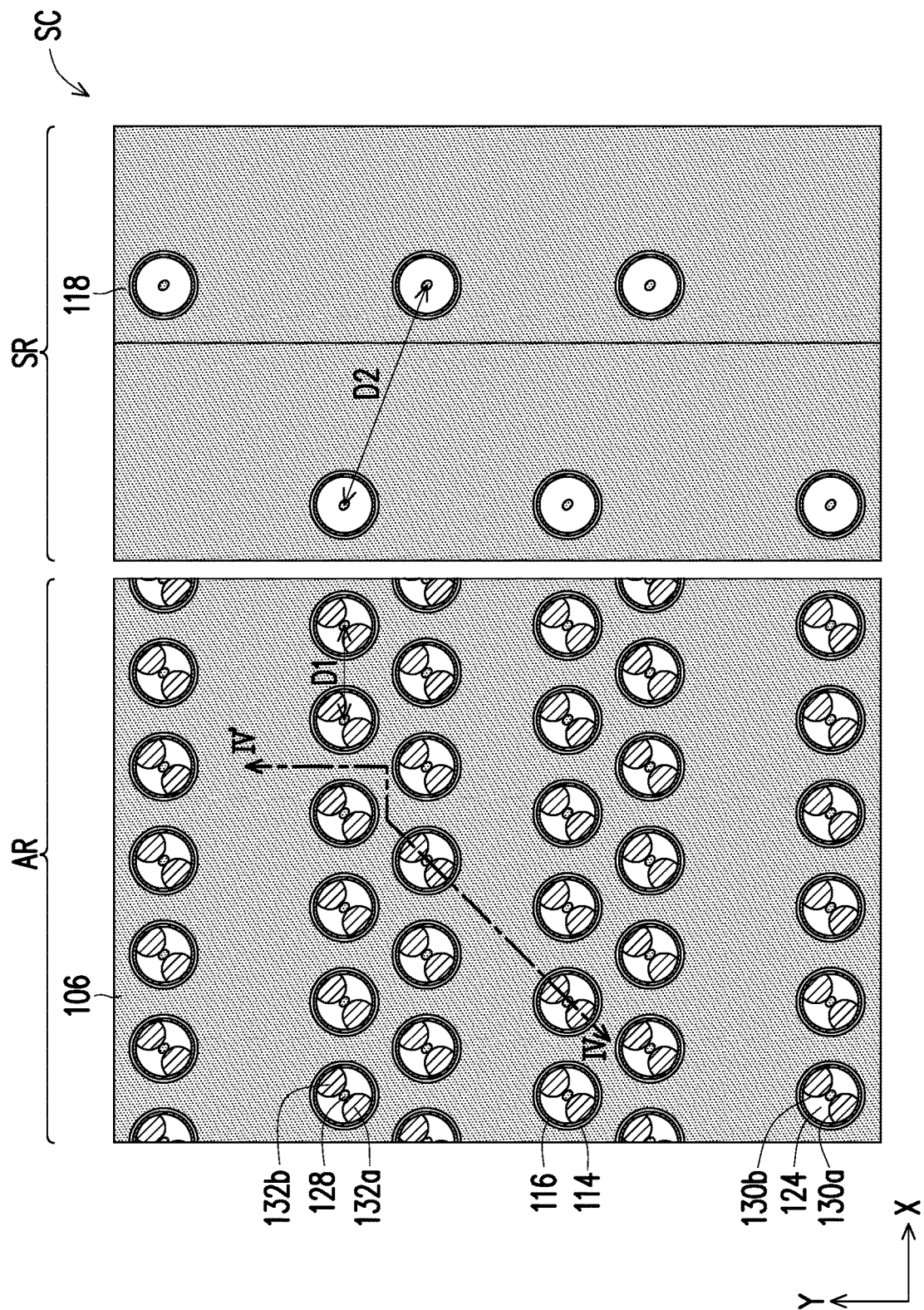
FIG. 3A to FIG. 3E show top views taken along line III-III' of FIG. 2C to FIG. 2G.

The stack structure SK1 is patterned to form a staircase structure SC in the staircase region SR (as shown in FIG. 3A and FIG. 5).

Figure 2B:
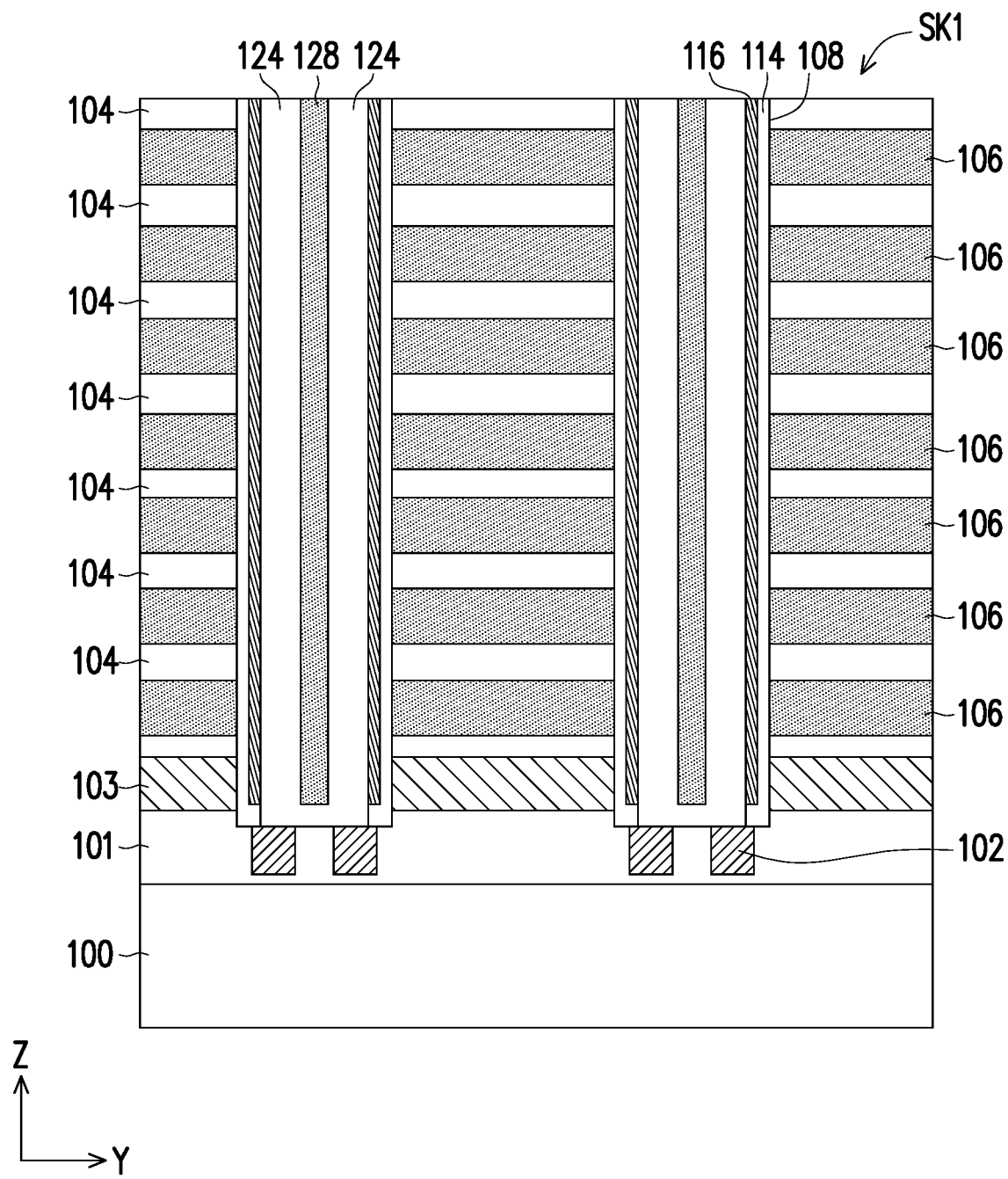

Next, referring to FIG. 2B and FIG. 3A, a plurality of openings 108 are formed in the stack structure SK1 in the array region AR. In this embodiment, the opening 108 extends through the conductive layer 103, and the bottom surface of the opening 108 exposes the stop layer 102 and the insulating layer 101, but the disclosure is not limited thereto. In this embodiment, in a top view, the opening 108 has a circular profile, but the disclosure is not limited thereto. In other embodiments, the opening 108 may have a profile of other shapes such as a polygonal shape (not shown).

Referring to FIG. 2B and FIG. 3A, a tunneling layer 114 and a channel pillar 116 are formed in the opening 108. The tunneling layer is, for example, a silicon oxide layer. The material of the channel pillar 116 may be semiconductor such as undoped polysilicon. The method of forming the tunneling layer 114 and the channel pillar 116 includes, for example, forming a tunneling material layer and a channel material layer on the stack structure SK1 and in the opening 108. Then, an etch-back process is performed to partially remove the tunneling material layer and the channel material layer to form the tunneling layer 114 and the channel pillar 116. The tunneling layer 114 and the channel pillar 116 cover the sidewall of the opening 108 and expose the bottom of the opening 108. The tunneling layer 114 and the channel pillar 116 may extend through the stack structure SK1 and extend into the insulating layer 101. In a top view, the channel pillar 116 has, for example, a ring shape and may be continuous in its extending direction (e.g., in a direction perpendicular to the dielectric substrate 100). In other words, the channel pillar 116 is integral in its extending direction and is not divided into multiple disconnected parts. In some embodiments, the channel pillar 116 may have a circular profile in a top view, but the disclosure is not limited thereto. In other embodiments, the channel pillar 116 may also have a profile of other shapes (e.g., a polygon) in a top view.

Figure 2C:
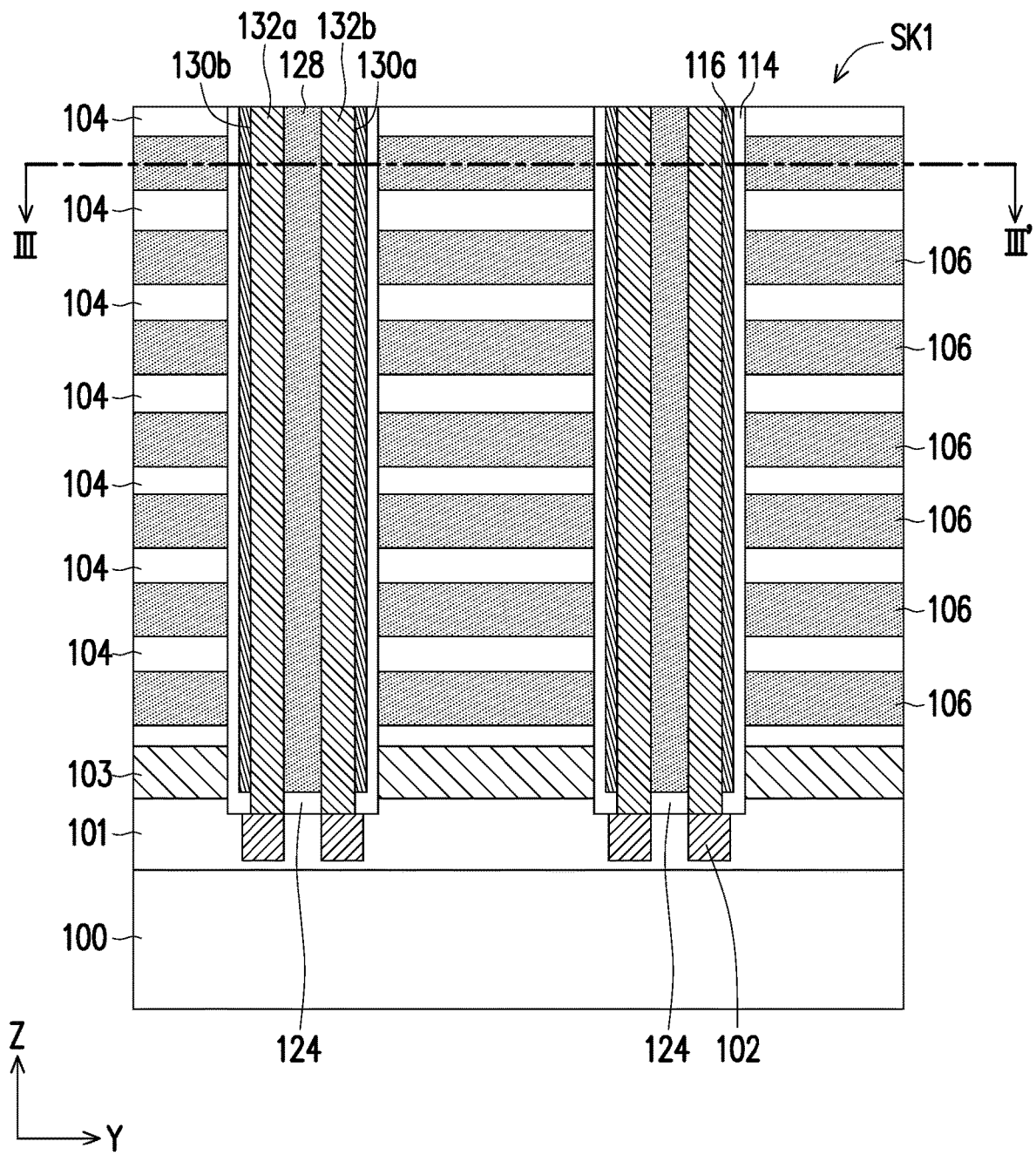
Figure 2D:
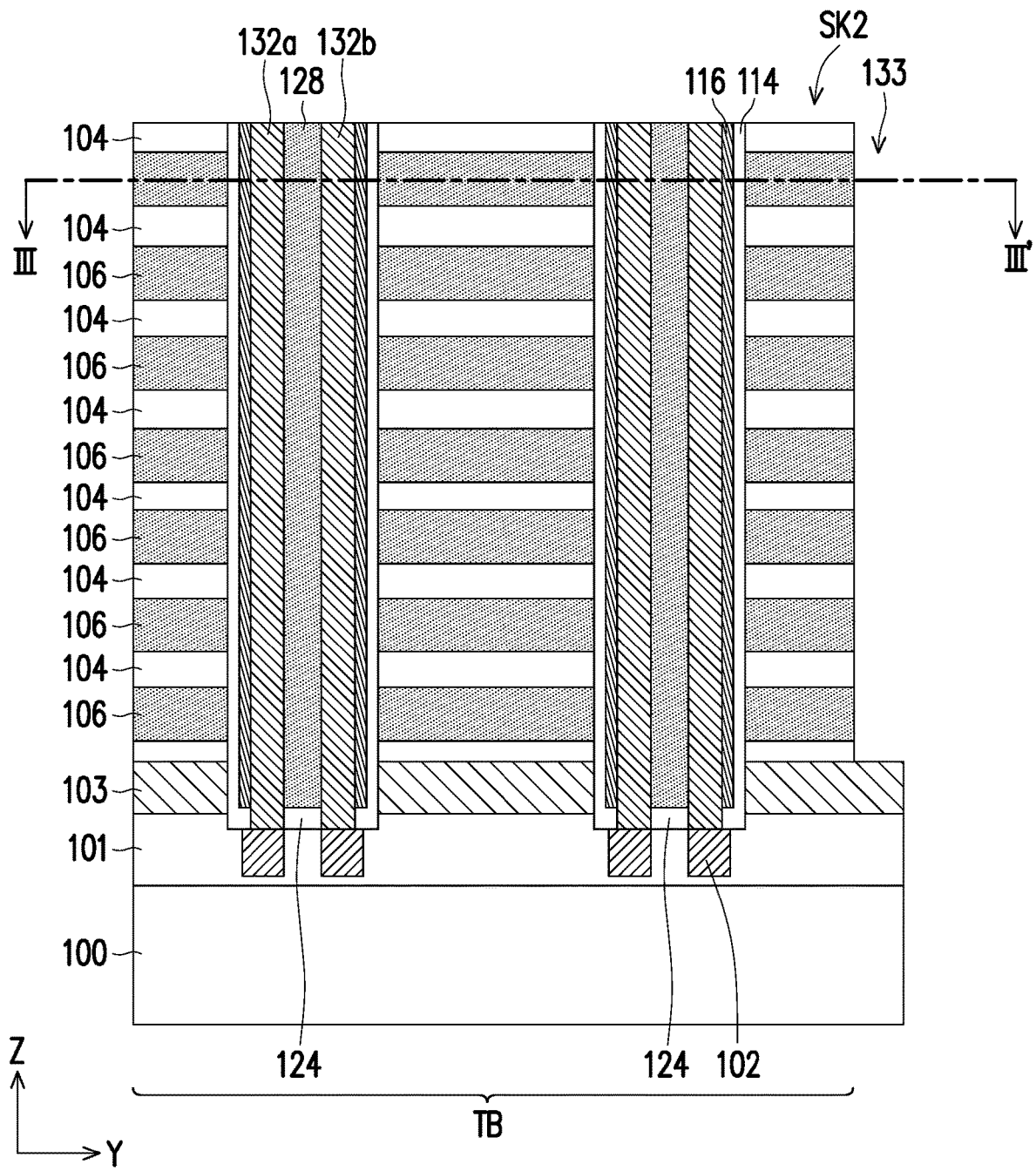
Figure 2E:
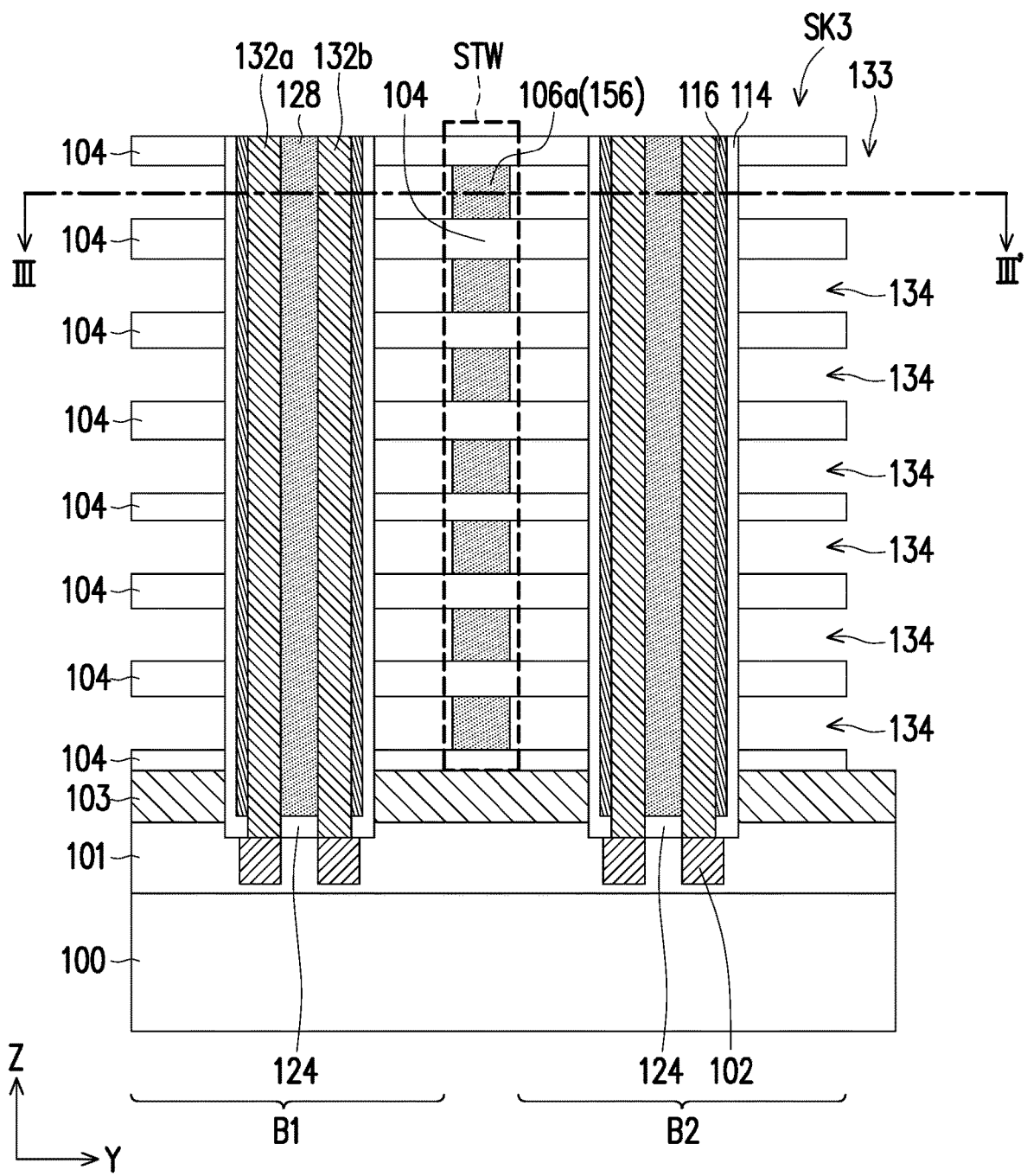
Figure 2F:
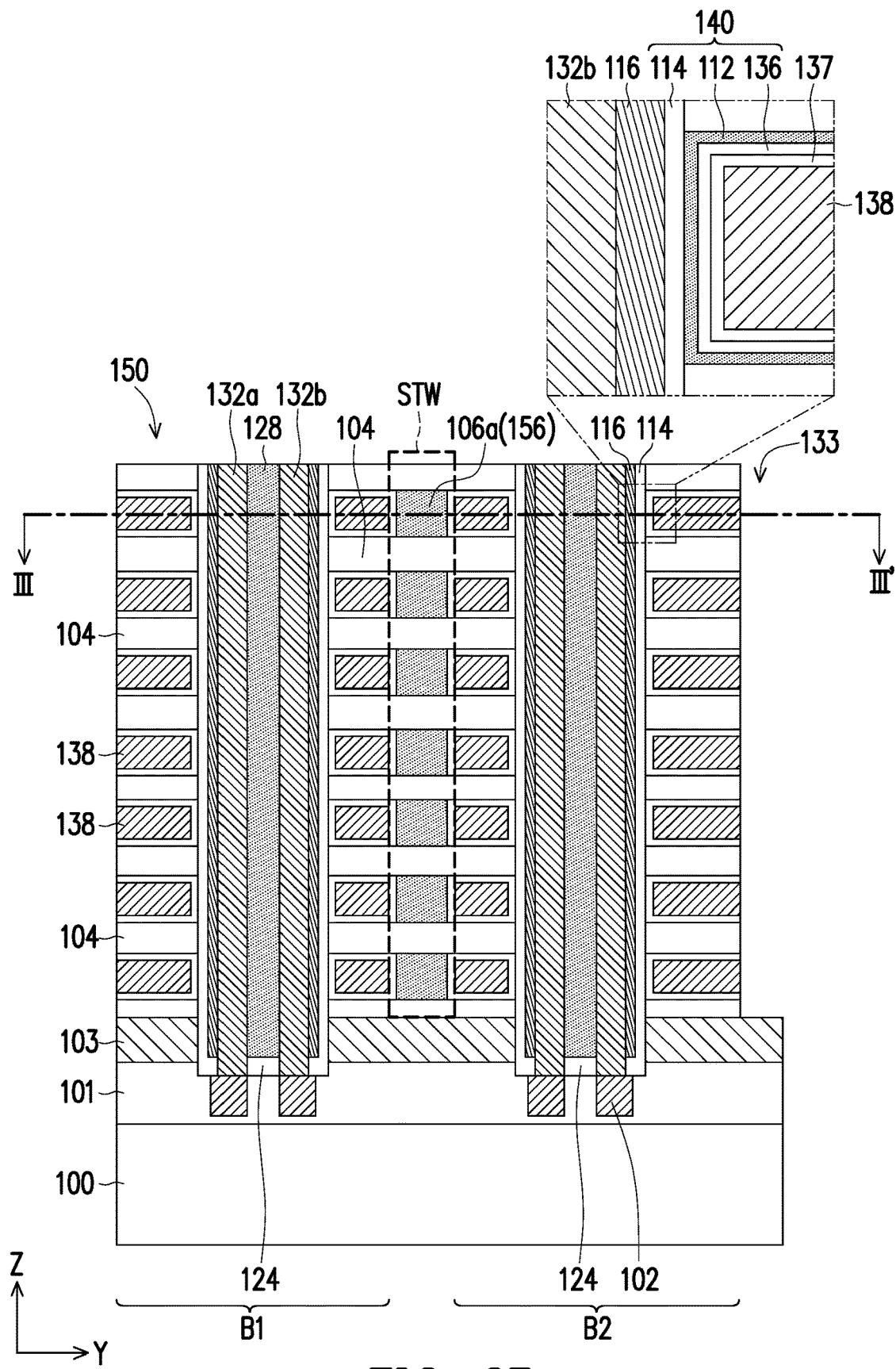

In this embodiment, the tunneling layer 114 of a charge storage structure 140 is formed in the opening, and a storage layer 112 and a blocking layer 136 of the charge storage structure 140 are formed in a horizontal opening 134 in the gate replacement process as shown in FIG. 2F.

Referring to FIG. 2B and FIG. 3A, an insulating filling layer 124 and an insulating pillar 128 are formed in the opening 108. The material of the insulating filling layer 124 is, for example, silicon oxide; the material of the insulating pillar 128 is, for example, silicon nitride. During filling of the insulating filling layer 124 in the opening 108, when the opening 108 is not completely filled and a hole is left, an insulating material different from the material of the insulating filling layer 124 is filled to completely seal the opening 108. After the insulating material is etched back to the surface of the insulating filling layer 124 through a dry etching or wet etching process, the insulating material remaining at the center of the opening 108 forms the insulating pillar 128.

Referring to FIG. 2C and FIG. 3A, a patterning process (e.g., photolithography and etching processes) is performed to form holes 130a and 130b in the insulating filling layer 124. In the etching process, the stop layer 102 may serve as an etch stop layer. Therefore, the formed holes 130a and 130b extend from the stack structure SK1 until the stop layer 102 is exposed. The profiles of the hole patterns defined in the patterning process may be tangent to the profile of the insulating pillar 128. The profiles of the hole patterns defined in the patterning process may also exceed the profile of the insulating pillar 128. Since the etching rate of the insulating pillar 128 is lower than the etching rate of the insulating filling layer 124, the insulating pillar 128 is hardly damaged by etching and remains. In addition, in some embodiments, the profiles of the hole patterns defined in the patterning process exceed the profile of the opening 108, so that the holes 130a and 130b expose part of the top insulating layer 104 of the stack structure SK1.

Referring to FIG. 3A, in some embodiments, dummy pillars 118 are further formed in the staircase region SR. The dummy pillars 118 may serve as support pillars in the subsequent gate replacement process. The dummy pillars 118 may be formed at the same time when the tunneling layer 114, the channel pillar 116, the insulating filling layer 124, and the insulating pillar 128 are formed. The dummy pillars 118 may also be formed separately. The number of the dummy pillars 118 may be determined according to the requirements. In some embodiments, the dummy pillars 118 in the staircase region SR are staggered with each other, and a distance D2 between the dummy pillars 118 in the staircase region SR is greater than or equal to a distance D1 between the channel pillars 116, and a density of the dummy pillars 118 is lower than a density of the channel pillars 116 in the array region AR.

Referring to FIG. 2C and FIG. 3A, conductive pillars 132a and 132b are formed in the holes 130a and 130b. The conductive pillars 132a and 132b may respectively serve as a source pillar and a drain pillar and are respectively electrically connected to the channel pillar 116. The conductive pillars 132a and 132b may be formed by forming a conductive layer on the insulating filling layer 124 and in the holes 130a and 130b, and then performing an etching-back process. The conductive pillars 132a and 132b are, for example, doped polysilicon. The radial dimensions of the conductive pillars 132a and 132b may be the same or different. A line connecting the centers of the conductive pillars 132a and 132b may form an acute angle with the Y direction (as shown in FIG. 3A), or may be parallel to the Y direction (not shown), i.e., being perpendicular to the subsequently formed slit SLT (as shown in FIG. 3E). In addition, the channel pillars 116 in two adjacent rows may be staggered with each other (as shown in FIG. 3A to FIG. 3E) or may be aligned with each other (not shown).

Figure 3B:
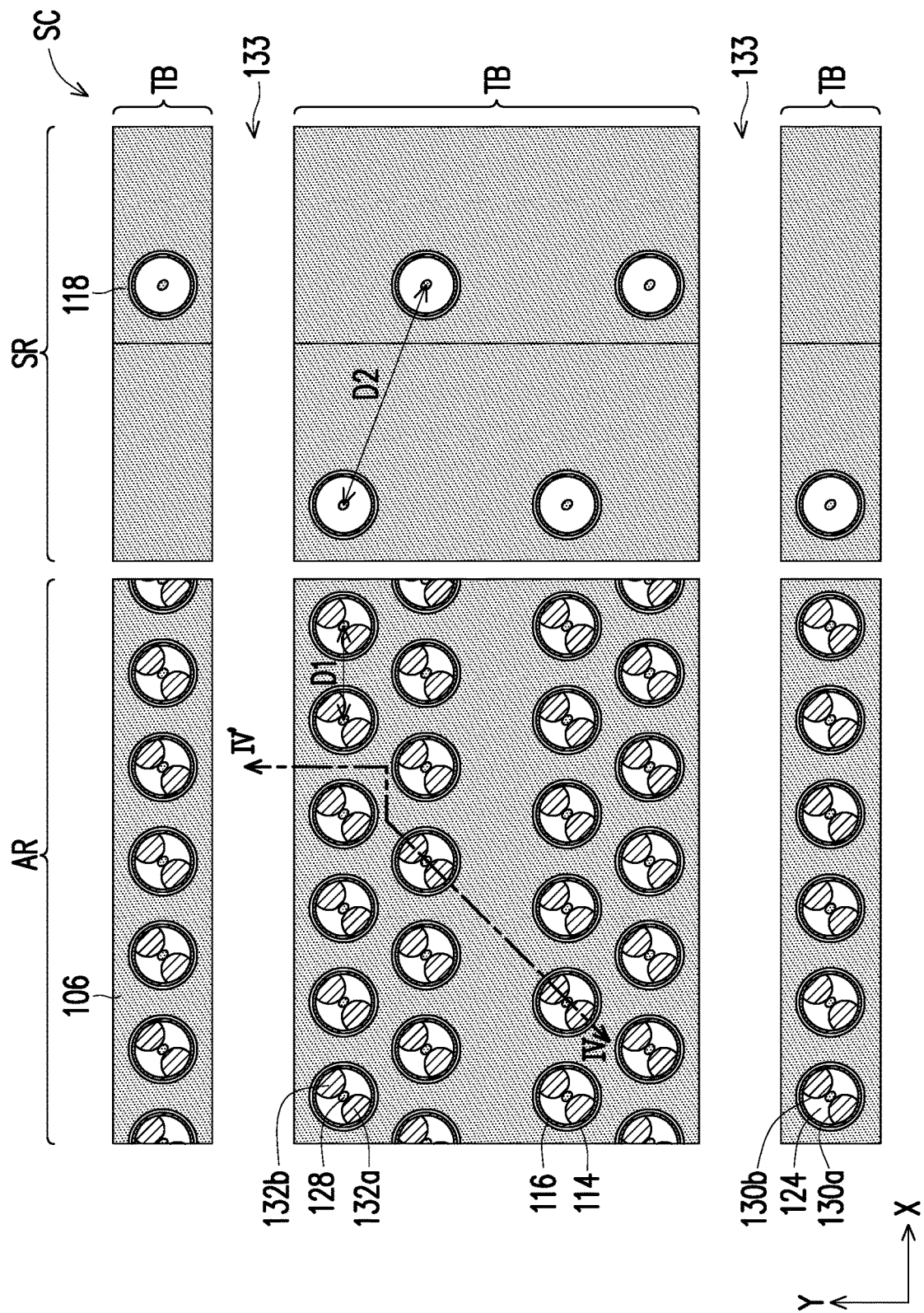

Afterwards, referring to FIG. 2D to FIG. 2G and FIG. 3B to FIG. 3E, a replacement process is performed to replace the middle layers 106 with a plurality of gate layers 138. First, referring to FIG. 2D and FIG. 3B, a patterning process (e.g., photolithography and etching processes) is performed on the stack structure SK1 to form a plurality of slit trenches 133 therein. In the etching process, the conductive layer 103 may serve as an etch stop layer, so that the slit trench 133 exposes the conductive layer 103.

referring to FIG. 3B, the slit trench 133 extends along the X direction, so that the stack structure SK1 in the array region AR and the staircase region SR is divided into a plurality of blocks TB. Each block TB includes a stack structure SK2, a plurality of channel pillars 116, and components located in the channel pillars 116 such as the conductive pillars 132a and 132b, the tunneling layer 114, the insulating filling layer 124, and the insulating pillar 128. The area of the block TB of the disclosure is twice or more of the area of a subsequently formed sub-block B and has a lower aspect ratio.

Figure 3C:
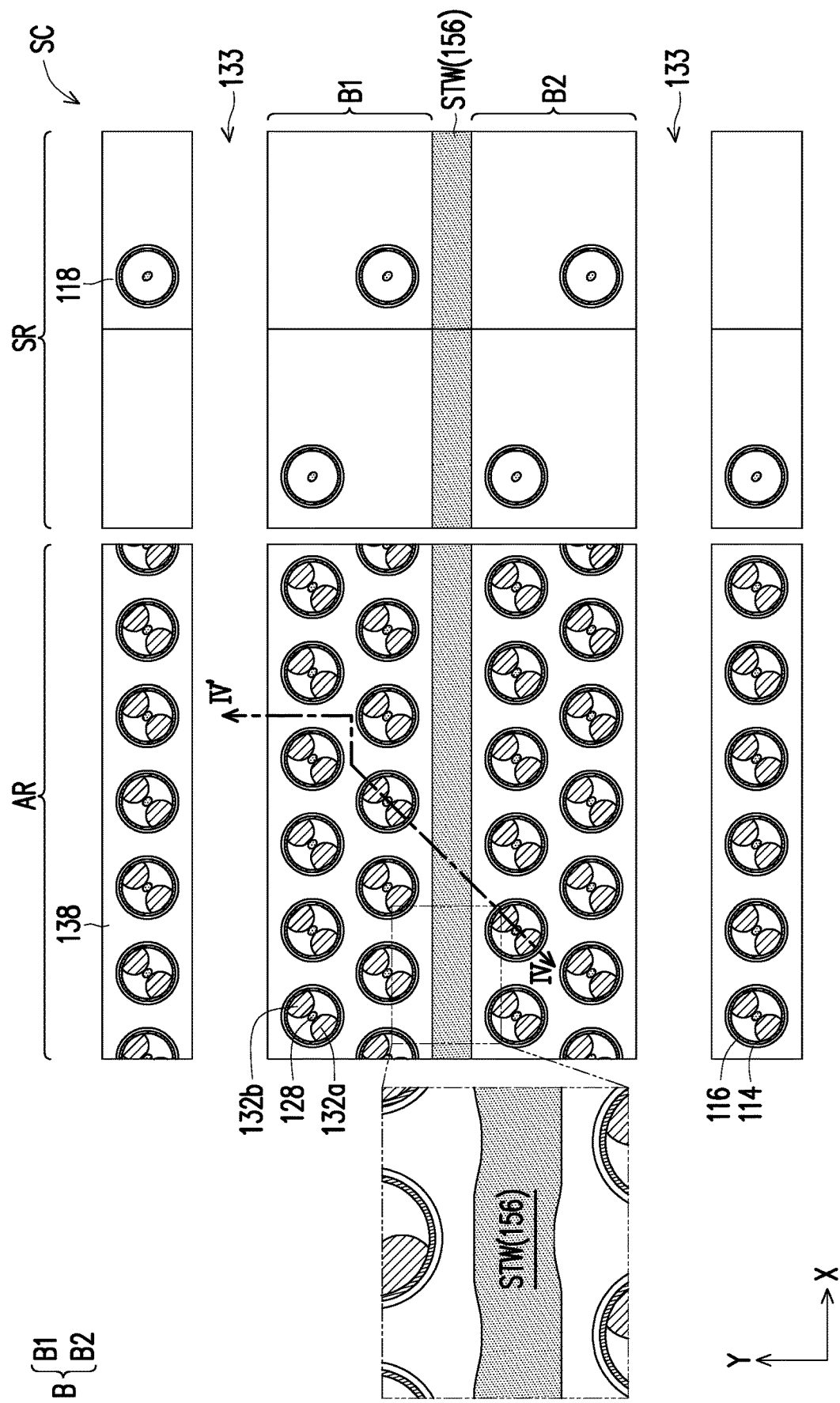

Next, referring to FIG. 2E FIG. 3C, an etching process such as a wet etching process is performed to remove part of the middle layers 106. An etching solution (e.g., hot phosphoric acid) used in the etching process is injected into the slit trenches 133, and then the contacted portion of the middle layers 106 is removed. Therefore, the portion of the middle layers 106 closer to the slit trenches 133 will be removed first, and the portion of the middle layers 106 farther away from the slit trenches 133 will be removed later. In the etching process, when the middle layers 106 between the channel pillar 116 and the slit trench 133 are removed, since the material of the tunneling layer 114 is different from the material of the middle layer 106, the tunneling layer 114 may serve as an etch stop layer to protect the channel pillar 116. The etching process is continued, and through time mode control, most of the middle layers 106 are removed to form a stack structure SK3 having a plurality of horizontal openings 134. The parts of the middle layers 106a farther from the slit trench 133 are left, and isolation layers 156 are formed. The isolation layer 156 is located between the two horizontal openings 134, as shown in FIG. 2E.

In some embodiments, in the staircase region SR, the density of the dummy pillars 118 is lower, so the etching rate is higher. In the array region AR, the density of the channel pillars 116 is higher, the flow rate of the etching solution is lower, the etching rate is lower, and a plurality of middle layers 106a farthest from the slit trenches 133 are retained. As a result, the width of the isolation layer 156 in the staircase region SR is different from the width of the isolation layer 156 in the array region AR (not shown). In addition, the isolation layer 56 of the wall STW has a curved profile in some embodiments. In addition to time control of the etching, the size of the retained isolation layer 156 may also be controlled by adjusting the size and density of the dummy pillars 118 in the staircase region SR and the size and density of the channel pillars 116 in the array region AR to control the etching rate of the middle layers 106 in the staircase region SR and the array region AR.

The isolation layers 156 and the insulating layers 104 are stacked alternately with each other in the Z direction to form a wall STW. Therefore, the wall STW may serve as a supporting structure together with the channel pillar 116 and the dummy pillar 118 to prevent tilting or collapse of the stack structure SK3, as shown in FIG. 2E and FIG. 3C.

In addition, with the middle layers 106a and the insulating layers 104 together serving as the wall STW, the block TB is divided into two sub-blocks B (e.g., sub-blocks B1 and B2). Since it is not necessary to form the slit trench 133 at the position of the wall STW in advance, the number of slit trenches 133 can be reduced, and a block TB having a larger cross-sectional area and a smaller aspect ratio can be reserved, in order to prevent tilting or collapse due to an overly small cross-sectional area and an overly large aspect ratio of the stack structure of the sub-block B, as shown in FIG. 4 and FIG. 5.

Figure 3D:
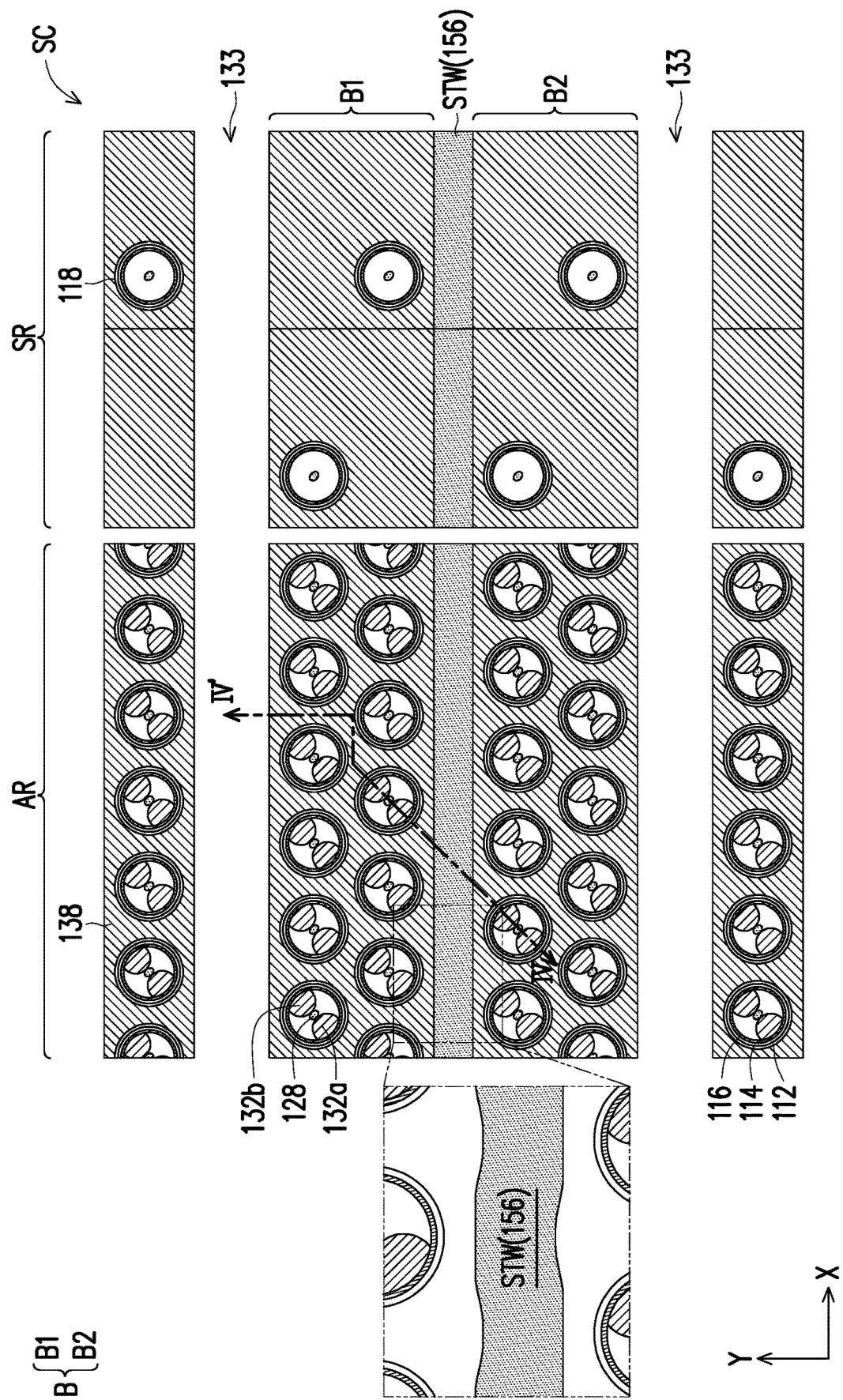
Figure 3E:
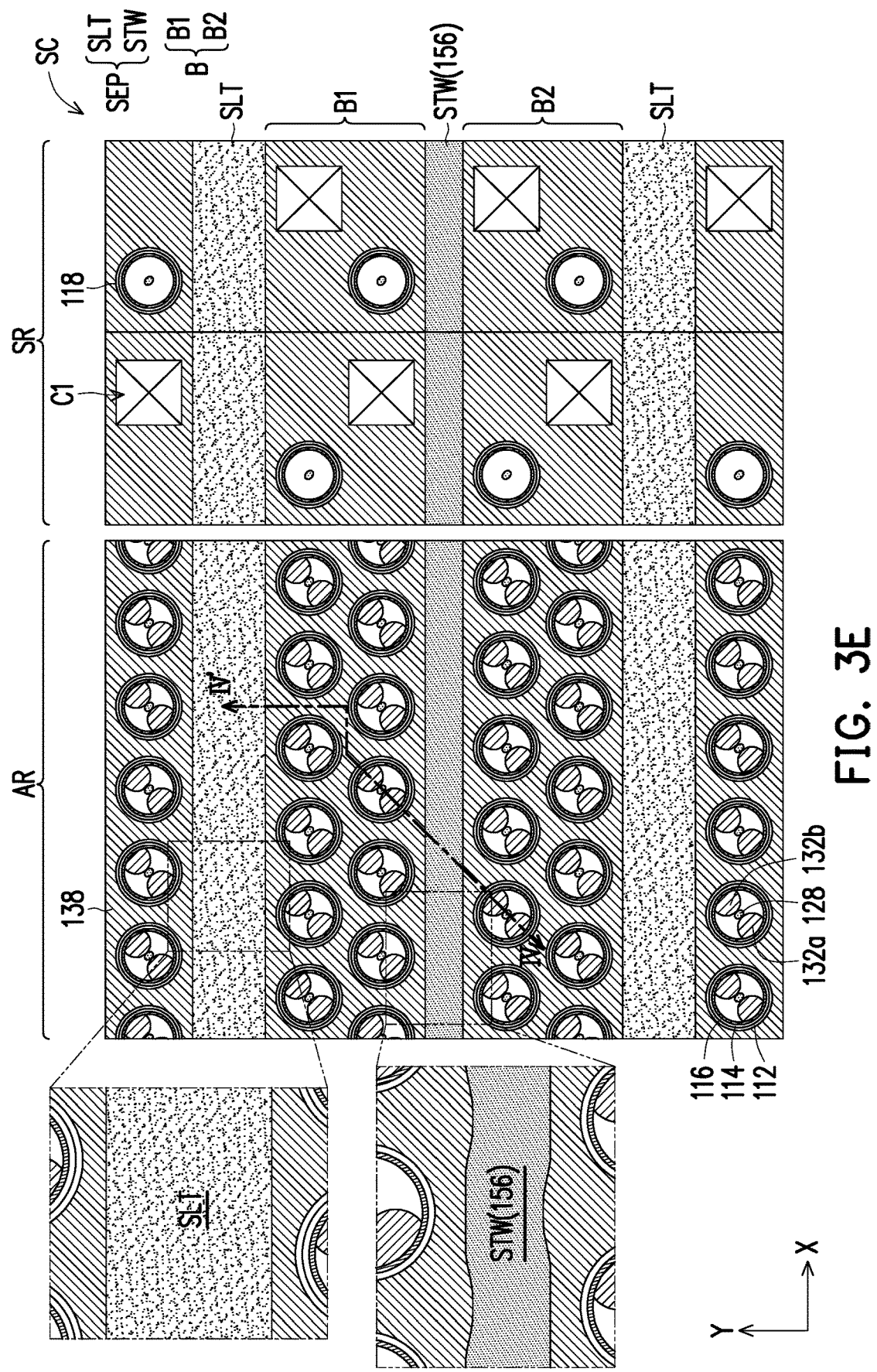

Referring to FIG. 2F and FIG. 3D, a plurality of storage layers 112, a plurality of blocking layers 136, and a plurality of gate layers 138 are formed in the horizontal openings 134. The material of the storage layer 112 is, for example, silicon nitride. The material of the blocking layer 136 is, for example, a high dielectric constant material having a dielectric constant greater than or equal to 7, such as aluminum oxide ($Al_2O_3$), hafnium oxide ($HfO_2$), lanthanum oxide ($La_2O_5$), transition metal oxide, lanthanide oxide, or combinations thereof. The material of the barrier material layer is, for example, titanium (Ti), titanium nitride (TiN), tantalum (Ta), tantalum nitride (TaN), or a combination thereof. The gate layer 138 is, for example, tungsten. In some embodiments, before the gate layers 138 are formed, a plurality of barrier layers 137 are formed. The material of the barrier layer 137 is, for example, titanium (Ti), titanium nitride (TiN), tantalum (Ta), tantalum nitride (TaN), or a combination thereof.

The method of forming the storage layer 112, the blocking layer 136, the barrier layer 137, and the gate layer 138 includes, for example, sequentially forming a storage material layer, a blocking material layer, a barrier material layer, and a conductive material layer in the slit trench 133 and the horizontal opening 134. Then, an etch-back process is performed to remove the storage material layer, the blocking material layer, the barrier material layer, and the conductive material layer in the slit trenches 133 to form the storage layer 112, the blocking layer 136, the barrier layer 137, and the gate layer 138 in the horizontal openings 134. The blocking layer 136, the tunneling layer 114, and the storage layer 112 are collectively referred to as a charge storage structure 140. At this time, a gate stack structure 150 is formed. The gate stack structure 150 is disposed on the dielectric substrate 100 and includes a plurality of gate layers 138 and a plurality of insulating layers 104 stacked alternately with each other. The isolation layers 156 are buried in the gate layers 138. Two sides of the isolation layer 156 are adjacent to the gate layers 138, as shown in FIG. 2F.

Figure 2G:
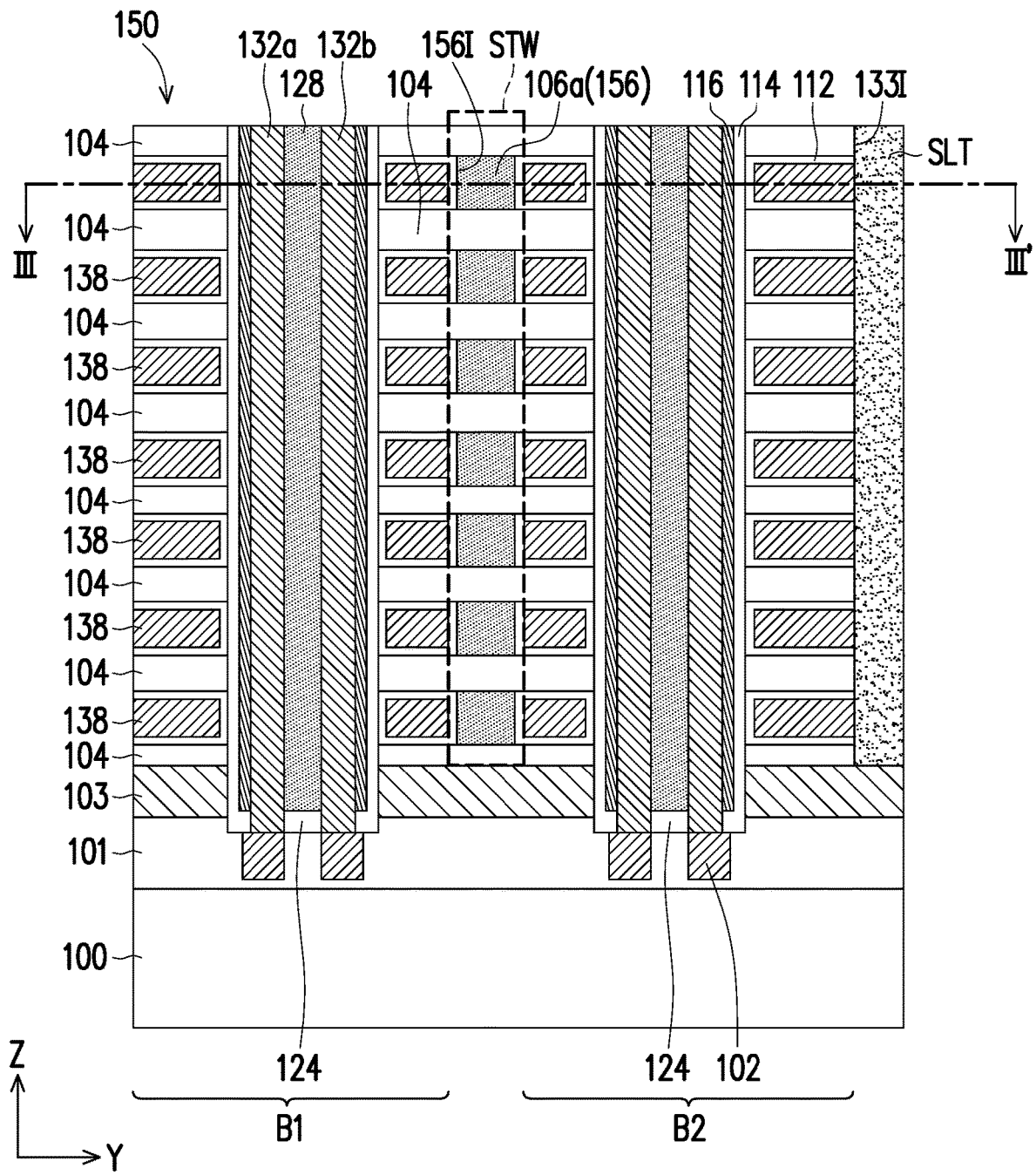

Referring to FIG. 2G and FIG. 3E, a slit SLT is formed in the slit trench 133. The method of forming the slit SLT includes filling an insulating material on the gate stack structure 150 and in the slit trench 133, and then removing the excessive insulating material on the gate stack structure 150 through an etch-back process or a planarization process. The insulating material is, for example, silicon oxide. The slit SLT is in contact with the adjacent storage layers 112, gate layers 138, and insulating layers 104, and has an interface 1331 therebetween. The isolation layers 156 of the wall STW are in contact with the adjacent storage layers 112, and have interfaces 1561 therebetween. The insulating layers 104 located above and below the isolation layer 156 in the wall STW continuously extend to below the storage layer 112. In other words, the interface 1331 extends continuously in the Z direction; and the interface 1561 extends discontinuously in the Z direction. The walls STW and the slits SLT alternately arranged in the Y direction and divide the gate stack structure 150 into a plurality of sub-blocks. The walls STW and the slits SLT form isolators SEP. A length of the isolation layer 156 in the staircase region SR is less or equal to than a length of the slits SLT in the staircase region SR as shown in FIG. 5.

Referring to FIG. 3E, afterwards, a contact C1 is formed in the staircase region SR. The contact C1 lands on the end of the gate layer 138 in the staircase region SR and is electrically connected thereto.

The above embodiments have been described based on a 3D AND flash memory. However, the embodiments of the disclosure are not limited thereto, and the embodiments of the disclosure may also be applied to a 3D NOR flash memory or a 3D NAND flash memory.

In the embodiments of the disclosure, when the gate replacement process is performed, part of the middle layers is retained to serve as the isolation layers. Therefore, the step may be integrated with the existing process without adding process steps, and the process variation may be effectively controlled by the etching process. Furthermore, the isolation layers may form the wall together with the insulating layers. The wall may serve as a supporting structure together with the channel pillar to prevent tilting or collapse of the stack structure. Therefore, it is possible to improve the yield and prevent misalignment resulting from tiling of the stack structure when subsequently forming a global bit line (GBL)

contact, which leads to a short circuit between the formed contact and the top gate layer.

What is claimed is:

1. A three-dimensional AND flash memory device comprising:
   a stack structure located on a dielectric substrate, wherein the stack structure comprises a plurality of gate layers and a plurality of insulating layers alternately stacked with each other;
   a plurality of isolators dividing the stack structure into a plurality of sub-blocks, the isolators comprising:
      a plurality of walls comprising a plurality of isolation layers and the plurality of insulating layers stacked alternately with each other, wherein the isolation layers are buried in the gate layers; and
      a plurality of slits alternating with the walls, wherein each of the slits extends through the gate layers and the insulating layers of the stack structure;
   a plurality of channel pillars extending through the stack structure in each of the sub-blocks;
   a plurality of source pillars and a plurality of drain pillars located in the channel pillars and electrically connected to the channel pillars; and
   a plurality of charge storage structures located between the gate layers and the channel pillar.

2. The three-dimensional AND flash memory device according to claim 1, wherein each of the isolation layers has a curved profile.

3. The three-dimensional AND flash memory device according to claim 1, wherein a length of each of the isolation layers is less than or equal to a length of each of the slits.

4. The three-dimensional AND flash memory device according to claim 1, wherein a length of each of the isolation layers in a staircase region of the dielectric substrate is less or equal to than a length of each of the slits in the staircase region.

5. The three-dimensional AND flash memory device according to claim 1, wherein a width of each of the isolation layers is less than or equal to a width of each of the slits.

6. The three-dimensional AND flash memory device according to claim 1, wherein a height of each of the isolation layers is less than a height of each of the slits.

7. The three-dimensional AND flash memory device according to claim 1, wherein a material of the isolation layers is different from a material of the slit.

8. The three-dimensional AND flash memory device according to claim 7, wherein the material of the isolation layers comprises silicon nitride, and the material of the slit comprises silicon oxide.

9. The three-dimensional AND flash memory device according to claim 1, wherein two sides of each of the isolation layers are adjacent to the gate layers.

10. The three-dimensional AND flash memory device according to claim 1, wherein each sidewall of the isolation layers is in contact with the charge storage structure.

11. A method of fabricating a three-dimensional AND flash memory device, comprising:
    forming a stack structure on a dielectric substrate, wherein the stack structure comprises a plurality of middle layers and a plurality of insulating layers stacked alternately with each other;
    forming a plurality of channel pillars extending through the stack structure;
    forming a plurality of source pillars and a plurality of drain pillars in the channel pillars, wherein the source pillars and the drain pillars are electrically connected to the channel pillars;
    patterning the stack structure to form a plurality of slit trenches in the stack structure, wherein each of the slit trenches extends through the middle layers and the insulating layers of the stack structure;
    partially removing the middle layers to form a plurality of horizontal openings, wherein an unremoved portion of the middle layers forms a plurality of isolation layers, the isolation layers and the insulating layers form a plurality of walls, and the slit trenches and the walls alternate with each other and divide the stack structure into a plurality of sub-blocks;
    forming a plurality of gate layers in the horizontal openings, wherein each of the isolation layers is sandwiched between the gate layers;
    forming a plurality of charge storage structures located between the gate layers and the channel pillar; and
    forming a plurality of slits in the slit trenches, wherein the slits and the walls alternate with each other and divide the stack structure into a plurality of sub-blocks.

12. The method of fabricating a three-dimensional AND flash memory device according to claim 11, wherein a length of each of the isolation layers is less than or equal to a length of each of the slits.

13. The method of fabricating a three-dimensional AND flash memory device according to claim 11, wherein a length of each of the isolation layers in a staircase region of the dielectric substrate is less than or equal to a length of each of the slits in the staircase region.

14. The method of fabricating a three-dimensional AND flash memory device according to claim 11, wherein a width of each of the isolation layers is less than or equal to a width of each of the slits.

15. The method of fabricating a three-dimensional AND flash memory device according to claim 11, wherein a material of the isolation layers is different from a material of the slit.

16. The method of fabricating a three-dimensional AND flash memory device according to claim 15, wherein the material of the isolation layers comprises silicon nitride, and the material of the slit comprises silicon oxide.

17. The method of fabricating a three-dimensional AND flash memory device according to claim 11, wherein sidewalls of each of the isolation layers are exposed from the horizontal openings.

18. The method of fabricating a three-dimensional AND flash memory device according to claim 17, wherein the charge storage structures are further formed in the horizontal openings and in contact with the sidewalls of the isolation layer.

* * * * *